(12) United States Patent
Mizutani et al.

(10) Patent No.: US 12,117,015 B2
(45) Date of Patent: Oct. 15, 2024

(54) CHARGER

(71) Applicant: MAKITA CORPORATION, Anjo (JP)

(72) Inventors: Shinya Mizutani, Anjo (JP); Junichi Murakami, Anjo (JP)

(73) Assignee: MAKITA CORPORATION, Anjo (JP)

( * ) Notice: Subject to any disclaimer, the term of this patent is extended or adjusted under 35 U.S.C. 154(b) by 76 days.

(21) Appl. No.: 17/914,219

(22) PCT Filed: Apr. 15, 2021

(86) PCT No.: PCT/JP2021/015536
§ 371 (c)(1),
(2) Date: Sep. 23, 2022

(87) PCT Pub. No.: WO2021/210629
PCT Pub. Date: Oct. 21, 2021

(65) Prior Publication Data
US 2023/0114444 A1   Apr. 13, 2023

(30) Foreign Application Priority Data

Apr. 16, 2020 (JP) ................................ 2020-073474

(51) Int. Cl.
*F04D 29/42* (2006.01)
*H02J 7/00* (2006.01)
*H05K 7/20* (2006.01)

(52) U.S. Cl.
CPC ........ *F04D 29/4226* (2013.01); *H02J 7/0042* (2013.01); *H05K 7/20172* (2013.01)

(58) Field of Classification Search
CPC .. F04D 29/4226; F04D 29/42; H05K 7/20172
See application file for complete search history.

(56) References Cited

U.S. PATENT DOCUMENTS 4,265,592 A * 5/1981 Carlini .................. F04D 29/464
   415/206
7,929,301 B2 * 4/2011 Fong ...................... H05K 5/063
   363/141

(Continued)

FOREIGN PATENT DOCUMENTS

JP   H10-270879 A   10/1998
JP   2008-186291 A   8/2008

(Continued)

OTHER PUBLICATIONS

Toshihiro, JP2016092910A English Translation, 2016 (Year: 2016).*

(Continued)

*Primary Examiner* — Michael L Sehn
(74) *Attorney, Agent, or Firm* — Oliff PLC

(57) ABSTRACT

A charger may include: a casing including an air inlet and an air outlet; an inner wall extending from an inner surface of the casing and defining an accommodating space between the inner surface of the casing and the inner wall; and a centrifugal fan including an air feed port and disposed in the accommodating space. The air outlet may be disposed to face the air feed port. The air inlet may be disposed closer to the centrifugal fan than the inner wall is. In a direction of a rotation axis of the centrifugal fan, a width between the inner wall and the centrifugal fan may be less than or equal to 150% of a width of the centrifugal fan.

9 Claims, 25 Drawing Sheets

(56) References Cited

U.S. PATENT DOCUMENTS

2008/0180910 A1     7/2008   Tomioka
2018/0317348 A1*   11/2018   Taga ..................... H02J 7/0042

FOREIGN PATENT DOCUMENTS

| JP | 2016-092910 A | 5/2016 |
| KR | 10-2005-0007659 A | 1/2005 |
| WO | 2009/033865 A1 | 3/2009 |

OTHER PUBLICATIONS

Jul. 11, 2023 Office Action issued in Japanese Patent Application No. 2022-515427.
Jun. 15, 2021 International Search Report issued in International Patent Application No. PCT/JP2021/015536.
Jun. 15, 2021 Written Opinion issued in International Patent Application No. PCT/JP2021/015536.

* cited by examiner

FIG. 18
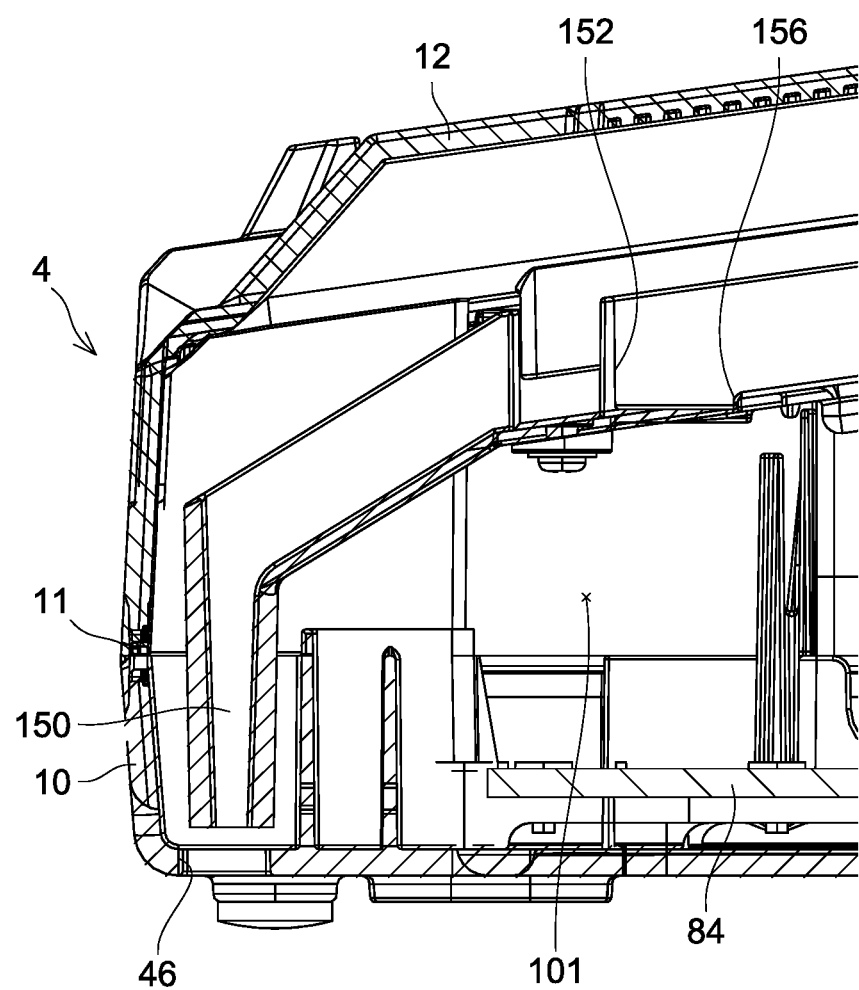
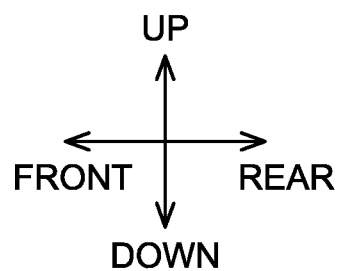

FIG. 23
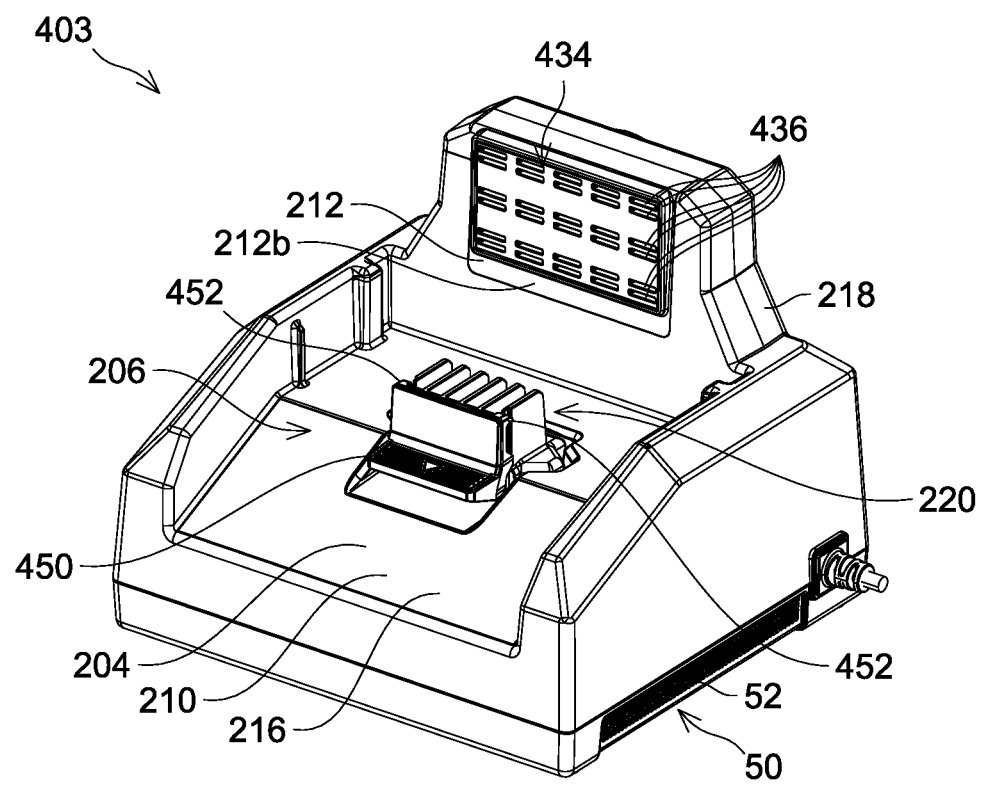
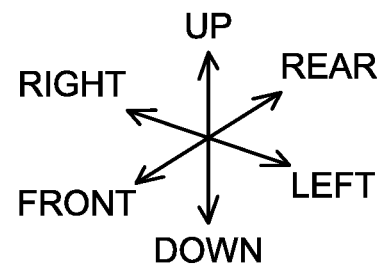

CHARGER

TECHNICAL FIELD

Techniques disclosed in the present specification relate to chargers.

BACKGROUND ART

International Publication No. 2009/033865 describes a charger. The charger comprises a casing including an air inlet and a centrifugal fan disposed in the casing. When the centrifugal fan rotates in the state where a battery pack is attached to the charger, air flows out from the battery pack through an air outlet defined in the battery pack and then flows into the casing through the air inlet. The battery pack is thereby cooled.

SUMMARY OF INVENTION

Technical Problem

For chargers such as the one described above, there is a need to reduce resistance against air flowing in the casing in order to enhance cooling efficiency for the battery pack. The specification herein discloses techniques for reducing resistance against air flowing in a charger.

Solution to Technical Problem

The present specification discloses a charger. The charger may comprise: a casing including an air inlet and an air outlet; an inner wall extending from an inner surface of the casing and defining an accommodating space between the inner surface of the casing and the inner wall; and a centrifugal fan including an air feed port and disposed in the accommodating space. The air outlet may be disposed to face the air feed port. The air inlet may be disposed closer to the centrifugal fan than the inner wall is. In a direction of a rotation axis of the centrifugal fan, a width between the inner wall and the centrifugal fan may be less than or equal to 150% of a width of the centrifugal fan.

In the configuration above, when the centrifugal fan rotates, air flows into the accommodating space through the air inlet and then flows to the centrifugal fan. Then, air fed from the centrifugal fan flows out from the casing through the air outlet. According to the configuration above, in the direction of the rotation axis of the centrifugal fan, the width between the inner wall and the centrifugal fan is less than or equal to 150% of the width of the centrifugal fan, and thus an increase in the size of the charger can be suppressed and resistance against the air flowing from the air inlet to the centrifugal fan can be reduced. Further, since the air outlet of the casing faces the air feed port of the centrifugal fan, resistance against the air flowing from the air outlet to the air feed port can be reduced. Accordingly, resistance against the air flowing in the charger can be reduced.

BRIEF DESCRIPTION OF DRAWINGS

FIG. 18 is a cross-sectional view in the vicinity of drainage outlets 46 of the lower casing 12 according to the first embodiment;

FIG. 23 is a perspective view of a charger 2 according to a third embodiment;

DESCRIPTION OF EMBODIMENTS

Figure 1:
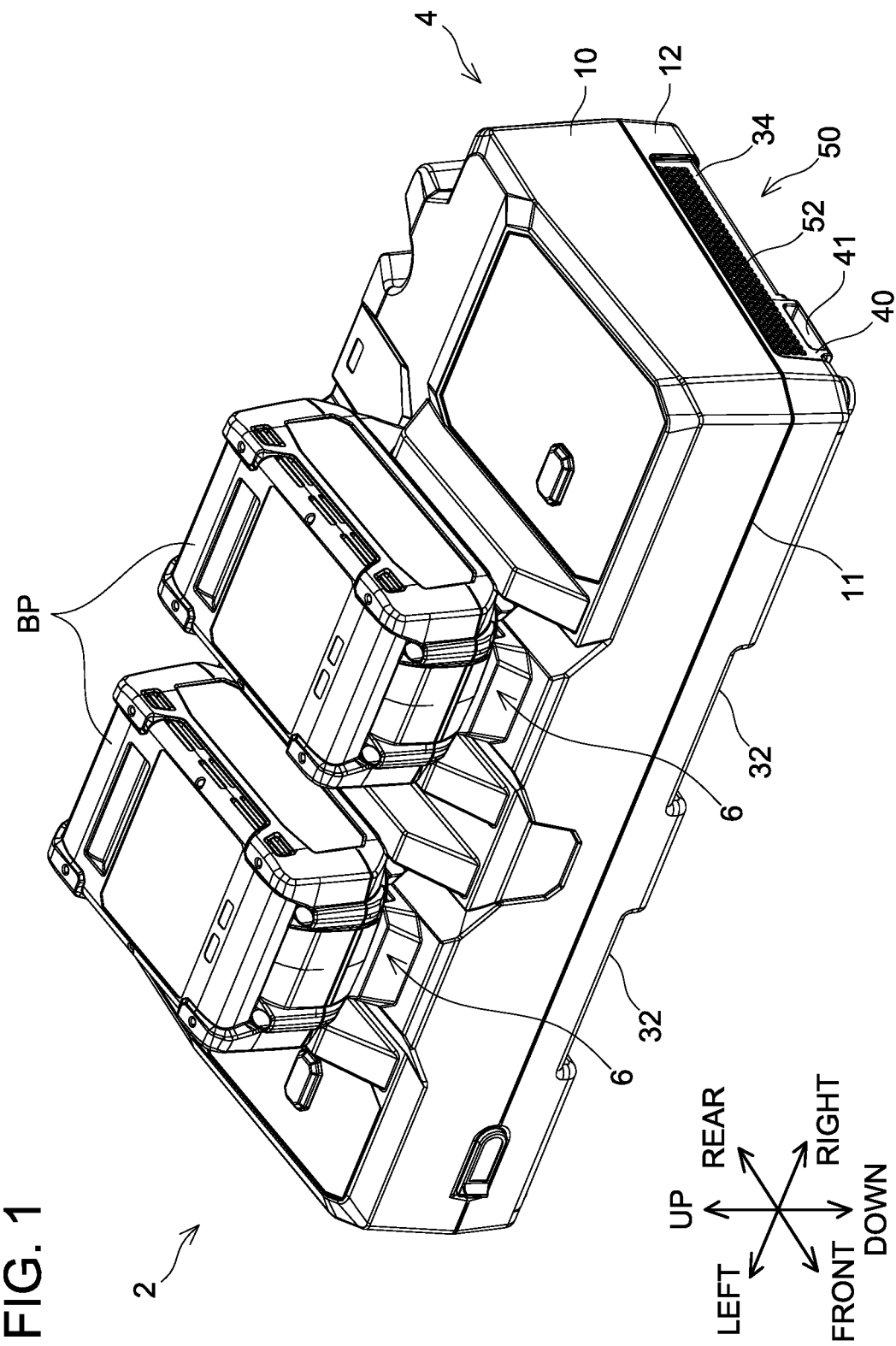
FIG. 1 is a perspective view of a charger 2 according to a first embodiment, with battery packs BP attached thereto.

Representative, non-limiting examples of the present disclosure will now be described in further detail with reference to the attached drawings. This detailed description is merely intended to teach a person of skill in the art further details for practicing preferred aspects of the present teachings and is not intended to limit the scope of the present disclosure. Furthermore, each of the additional features and teachings disclosed below may be utilized separately or in conjunction with other features and teachings to provide improved chargers, as well as methods for using and manufacturing the same.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for die purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

In one or more embodiments, the charger may comprise: a casing including an air inlet and an air outlet; an inner wall extending from an inner surface of the casing and defining an accommodating space between the inner surface of the casing and the inner wall; and a centrifugal fan including an air feed port and disposed in the accommodating space. The air outlet may be disposed to face the air feed port. The air inlet may be disposed closer to the centrifugal fan than the inner wall is. In a direction of a rotation axis of the centrifugal fan, a width between the inner wall and the centrifugal fan may be less than or equal to 150% of a width of the centrifugal fan.

In the configuration above, when the centrifugal fan rotates, air is suctioned into the accommodating space through the air inlet and then flows to the centrifugal fan. Then, the air fed from the centrifugal fan flows out from the casing through the air outlet. According to the configuration above, in the direction of the rotation axis of the centrifugal fan, the width between the inner wall and the centrifugal fan is less than or equal to 150% of the width of the centrifugal fan, and thus an increase in the size of the charger can be suppressed and resistance against the air flowing from the air inlet to the centrifugal fan can be reduced. Further, since the air outlet of the casing faces the air feed port of the centrifugal fan, resistance against the air flowing from the air outlet to the air feed port can be reduced. Accordingly, resistance against the air flowing in the charger can be reduced.

In one or more embodiments, in the direction of the rotation axis, the air inlet may be disposed between the inner wall and the centrifugal fan.

If the air inlet is not disposed between the inner wall and the centrifugal fan in the direction of the rotation axis, for example, if the air inlet is disposed immediately above the centrifugal fan, the air suctioned into the accommodating space through the air inlet flows toward the inner wall and then makes a turn to flow toward the centrifugal fan. According to the configuration above, the air suctioned into the accommodating space through the air inlet reaches the centrifugal fan without making a turn. Thus, resistance against the air flowing from the air inlet to the centrifugal fan can be further reduced. As a result, resistance against the air flowing in the charger can be further reduced.

In one or more embodiments, when the charger is placed on a placement plane, air may be ted from the air feed port of the centrifugal fan in a down direction perpendicular to the placement plane. The air outlet may be disposed below the air feed port.

Liquid such as water may enter the accommodating space through the air inlet of the casing. According to the configuration above, even when liquid enters the accommodating space, it can be discharged to the outside of the casing through the air outlet.

In one or more embodiments, in the direction of the rotation axis, the width between the inner wall and the centrifugal fan may be less than or equal to 50% of a diameter of a blade unit of the centrifugal fan.

According to the configuration above, the increase in the size of the charger can be suppressed and air can be taken into the centrifugal fan more efficiently.

In one or more embodiments, the charger may further comprise a rib extending from the inner surface of the casing such that the rib is disposed adjacent to the air outlet. The centrifugal fan may be supported by the rib such that the centrifugal fan is spaced from the inner surface of the casing.

If the centrifugal fan is in contact with the inner surface of the casing, vibration of the centrifugal fan, which is caused by the rotation of the centrifugal fan, is transmitted to the casing, which may result in noise. According to the configuration above, the centrifugal fan is spaced from the inner surface of the casing by being supported by the rib, and thus the noise caused by the rotation of the centrifugal fan can be suppressed.

In one or more embodiments, the rib may be disposed at a peripheral portion of the air feed port of the centrifugal fan.

If the rib is disposed to block the air feed port, wind noise of the centrifugal fan caused by the rotation of the centrifugal fan may be increased. In the configuration above, the rib does not block the air feed port of the centrifugal fan. Accordingly, the wind noise of the centrifugal fan caused by the rotation of the centrifugal fan can be suppressed, and thus increased noise can be suppressed.

In one or more embodiments, a recess may be defined in an outer surface of the casing. The air outlet may be disposed in the recess.

If the air outlet is blocked by the placement plane on which the charger is placed, an amount of air flowing in the accommodating space by the rotation of the centrifugal fan decreases. This may cause a decrease in the cooling efficiency for the battery pack being on charge by the charger. In the configuration above, the air outlet is not blocked even when the charger is placed on the placement plane. Thus, a decrease in the amount of air flowing in the accommodating space can be suppressed. As a result, the decrease in the cooling efficiency for the battery pack being on charge by the charger can be suppressed.

In one or more embodiments, a charger may comprise a casing including an air inlet port and an air outlet port, and a fan that is disposed in the casing and is configured to generate an air flow from the air inlet port toward the air outlet port. The air inlet port may include a plurality of first air inlets defined in a side surface of the casing. The plurality of first air inlets may be open toward the inside of the casing from a side portion of the side surface. The air outlet port may include a plurality of air outlets defined in the casing. An inscribed circle of each of the plurality of first air inlets may be smaller than an inscribed circle of each of the plurality of air outlets.

In the configuration above, the plurality of first air inlets is defined in the side surface of the casing, and thus the area of a bottom surface of the casing and the dimensions of the casing in a left-right direction and a front-rear direction can be reduced as compared with a configuration in which air inlets are defined only in the bottom surface of the casing.

In one or more embodiments, the air inlet port may include a plurality of second air inlets defined in the bottom surface of the casing.

In the configuration above, even when liquid enters the casing through the plurality of first air inlets, the liquid can be discharged from the casing through the plurality of second air inlets.

In one or more embodiments, the plurality of first air inlets may be separate from the plurality of second air inlets.

The configuration above can reduce entry of foreign matters into the casing through the air inlet port as compared with a configuration in which the plurality of first air inlets is connected with the plurality of second air inlets.

In one or more embodiments, the casing may comprise a first recess recessed from the side surface and a second recess recessed from the bottom surface. The plurality of first air inlets may be disposed in the first recess. The plurality of second air inlets may be disposed in the second recess.

If the plurality of first air inlets and the plurality of second air inlets are blocked by surfaces such as walls, an amount of air taken into the casing through the plurality of first air inlets and the plurality of second air inlets by the rotation of the fan decreases. The cooling efficiency for electric components in the casing may thereby be decreased. In the configuration above, even when surfaces such as walls are in contact with the side surface and the bottom surface of the casing, the plurality of first air inlets and the plurality of second air inlets are not blocked. Thus, a decrease in the amount of air taken into the casing through the plurality of first air inlets and the plurality of second air inlets can be suppressed. As a result, the decrease in the cooling efficiency for electric components, etc. in the casing can be suppressed.

In one or more embodiments, the charger may further comprise a rib extending from a lower inner surface of the casing. The rib may be disposed between the air inlet port and the air outlet port in a direction of air flow in the casing. A distal end of the rib may be positioned above the plurality of first air inlets.

In the configuration above, the distal end of the rib is positioned above the plurality of first air inlets, and thus even when a foreign matter enters the casing through the plurality of first air inlets, the rib can suppress the foreign matter from going deeper into the casing.

In one or more embodiments, the charger may further comprise a circuit board that is disposed in the casing and has a longitudinal axis. The air inlet port may be disposed on a first direction side of the circuit board along the longitudinal axis. The air outlet port may be disposed on a second direction side of the circuit board, which is opposite to the first direction side, along the longitudinal axis.

In the configuration above, the air taken into the casing through the air inlet port flows toward the longitudinal axis of the circuit board. The circuit board can thereby be efficiently cooled.

In one or more embodiments, a battery-related device may comprise an upper casing in which an electric component is disposed; a lower casing in which a circuit board is disposed, wherein the lower casing is configured to be combined with the upper casing; a connection line connecting the electric component to the circuit board; and a duct that surrounds the connection line between the upper casing and the duct and guides the connection line from the upper casing to the lower casing. The duct may extend from the upper casing side to the lower casing side.

In the configuration above, the connection line is connected to the electric component and is disposed between the upper casing and the duct. The connection line is connected to the circuit board, and the upper casing is combined with the lower casing. In the configuration above, positioning of the connection line can be done by the simple process of disposing the connection line between the upper casing and the duct. This facilitates combining the upper casing with the lowercasing. Further, once the upper casing and the lower casing are combined together, damage to the connection line due to the connection line touching a corner of the electric component can be suppressed.

In one or more embodiments, the duct may comprise a first duct portion that is integrally formed with the upper casing and includes an opening, wherein the opening allows insertion and removal of the connection line; and a second duct portion that is detachably attached to the upper casing and has a shape covering the opening of the first duct portion.

In the configuration above, the connection line already connected to the electric component is disposed in the first duct portion by being inserted into the opening of the first duct portion, and the second duct portion is attached to the upper casing. The opening is thereby covered by the second duct portion. As a result, the connection line is surrounded by the first duct portion, the second duct portion, and the upper casing. Thus, the connection line can be suppressed from being caught between the upper casing and the lower casing when the upper casing is combined with the lower casing, thereby facilitating combining the upper casing with the lower casing. Further, once the upper casing and the lower casing are combined together, damage to the connection line due to the connection line touching a corner of the electric component can be suppressed.

In one or more embodiments, the upper casing may further comprise a projection extending from an inner surface of the upper casing. The second duct portion may include a through hole that receives the projection when the second duct portion is attached to the upper casing.

If the connection line is caught between the second duct portion and the upper casing in attaching the second duct portion to the upper casing, the connection line may be damaged. In the configuration above, the second duct portion includes the through hole that receives the projection, and thus whether the connection line is caught between the second duct portion and the upper casing or not can be visually observed via the through hole. Specifically, if the connection line is caught between the second duct portion and the upper casing, the connection line hangs over the projection and thus extends out through the through hole. As a result, the connection line being caught between the second duct portion and the upper casing can be visually observed via the through bole. Thus, when the connection line is caught between the second duct part and the upper casing, the second duct portion can be detached from the upper casing to adjust the position of the connection line and be attached again to the upper casing, thereby the upper casing and the lower casing can be suppressed from being combined together with the connection line caught therebetween.

In one or more embodiments, the second duct portion may comprise a first guide guiding the connection line and a second guide that is separate from the first guide and guides liquid having entered between the upper casing and the lower casing.

Liquid such as water may enter a space between the upper casing and the lower casing. In the configuration above, the liquid flowing in the second guide can be suppressed from adhering to the connection line guided by the first guide. Thus, the liquid is suppressed from flowing down the connection line and reaching the electric component and/or the circuit board.

In one or more embodiments, the upper casing may comprise an upper recess recessed from an upper outer surface of the upper casing that corresponds to an upper surface of the battery-related device. The lower casing may comprise a lower recess recessed from a lower outer surface of the lower casing that corresponds to a bottom surface of the battery-related device.

With the configuration above, a user can easily carry the battery-related device by grabbing the upper recess and the lower recess with his/her hand.

In one or more embodiments, the upper casing may further comprise an upper projection disposed in the upper recess. Further, the lower casing may further comprise a lower projection disposed in the lower recess.

With the configuration above, the user can carry the charger stably by hooking fingers of his/her hand on the upper projection and the lower projection when grabbing the upper recess and the lower recess with the hand.

A charger may be configured to charge a battery pack. The charger may comprise: a casing defining an accommodating space and a board space therein and including an air inlet and an air outlet; a fan disposed in the accommodating space and including a fan air inlet; and a circuit board disposed in the board space and configured to control charging of the battery pack. The accommodating space may communicate with a space outside of the charger via the air inlet and the air outlet. When the fan rotates about a rotation axis, air may flow into the accommodating space through the air inlet and flow toward the air outlet so that the battery pack on charge is cooled. When the charger is placed on a placement plane, the accommodating space may be positioned above the board space in an up-down direction parallel to a gravity direction.

For example, in a configuration in which air flows through both of the accommodating space and the board space when the fan rotates, water and/or dust contained in the air enter the board space. If the water and/or dust contact(s) the circuit board, the circuit board may malfunction. Since the air flows through the accommodating space in the configuration above, the entry of water and/or dust contained in the air into the board space can be suppressed. Thus, the malfunction of the circuit board can be suppressed and the increase in the size of the charger in a direction perpendicular to the up-down direction can be suppressed.

In one or more embodiments, the casing may comprise a first wall facing the fan air inlet in a direction along the rotation axis and a second wall facing the first wall in the direction along the rotation axis. The air inlet may be defined in the first wall. The air outlet may be defined in the second wall.

If the air inlet is not defined in the first wall, air that flowed into the accommodating space through the air inlet changes its flow direction significantly to flow to the fan air inlet. Further, if the air outlet is not defined in the second wall, air fed out from the fan changes its flow direction significantly to flow to the air outlet. In the configuration above, the air inlet is defined in the first wall and the air outlet is defined in the second wall, and thus the air flowed into the accommodating space through the air inlet can flow to the fan air inlet without changing its flow direction significantly, and the air fed out from the fan can also flow to the air outlet without changing its flow direction significantly. Thus, resistance against the air flowing through the accommodating space can be reduced.

In one or more embodiments, in the direction along the rotation axis, a distance between the first wall and the fan air inlet may be less than or equal to 50% of a diameter of a blade unit of the fan.

In the configuration above, the increase in the size of the charger can be suppressed and resistance against the air flowing from the air inlet to the fan air inlet can be reduced.

In one or more embodiments, in the direction along the rotation axis, a distance between the first wall and the fan air inlet may be less than or equal to 25% of a diameter of a blade unit of the fan.

In the configuration above, the increase in the size of the charger can be suppressed and the resistance against the air flowing from the air inlet to the fan air inlet can be further reduced.

In one or more embodiments, in the direction along the rotation axis, a distance between the first wall and the second wall may be less than or equal to 200% of a width of the fan.

In the configuration above, the increase in the size of the charger can be suppressed.

In one or more embodiments, in the direction along the rotation axis, a distance between the first wall and the fan air inlet may be less than or equal to 150% of a width of the fan.

In the configuration above, an increase in the size of the charger can be suppressed and the resistance against the air flowing from the air inlet to the fan air inlet can be reduced.

In one or more embodiments, the battery pack may include a battery air outlet communicating a space inside of the battery pack with a space outside of the battery pack. When the fan rotates, air inside of the battery pack may flow into the accommodating space through the battery air outlet and the air inlet and flow toward the air outlet so that the battery pack on charge is cooled.

In a configuration in which air fed out by the fan cools the battery pack, the air fed out by the fan enters the battery pack and may flow around only a part of battery cells in the battery pack. This may lead to failing to cool the battery pack uniformly. In the configuration above, the air inside of the battery pack flows into the accommodating space through the battery air outlet and the air inlet due to a negative pressure generated by the rotation of the fan. Thus, the air inside of the battery pack flows around all of battery cells in the battery pack. As a result, the battery pack can be cooled uniformly.

In one or more embodiments, when the battery pack is attached to the charger, the air inlet may face the battery air outlet.

The configuration above facilitates the air inside of the battery pack to flow into the accommodating space through the battery air outlet and the air inlets.

In one or more embodiments, the charger may further comprise a battery attachment part to which the battery pack is attached. When the charger is placed on the placement plane, the board space may be positioned below the battery attachment part, and the accommodating space may be positioned in a direction perpendicular to the up-down direction with respect to the battery attachment part.

In the configuration above, a space positioned above the board space except for the accommodating space can be efficiently used.

In one or more embodiments, the fan may comprise a centrifugal fan.

A static pressure generated by the rotation of a centrifugal fan is higher than a static pressure generated by the rotation of an axial fan. The configuration above can flow air in the battery pack even when resistance against the air in the battery pack is high.

In one or more embodiments, as the charger is viewed in a direction along the rotation axis, the air inlet may not overlap the air outlet.

In a case the fan is a centrifugal fan, air is fed out from the fan in a direction perpendicular to the rotation axis. In a configuration in which the air inlet overlaps the air outlet as the charger is viewed in the direction along the rotation axis, the air fed out from the fan changes its flow direction several times before reaching the air outlet. This increases resistance against the air flowing from the fan to the air outlet. In the configuration above, the air fed out from the fan changes its flow direction less frequently as compared with the configuration in which the air inlet overlaps the air outlet as the charger is viewed in the direction along the rotation axis. Thus, the resistance against the air flowing from the fan to the air outlet can be reduced.

In one or more embodiments, the fan may comprise an axial fan.

In the configuration above, air flows through the accommodating space without changing its flow direction owing to the rotation of the axial fan. Thus, resistance against the air flowing through the accommodating space can be reduced.

In one or more embodiments, as the charger is viewed in a direction along the rotation axis, the air inlet may at least partially overlap the fan and the air outlet.

In a case the fan is an axial fan, air is fed out from an air outlet of the fan in a direction along the rotation axis. In the configuration above, the air inlet at least partially overlaps the fan and the air outlet as the charger is viewed in the direction along the rotation axis, and thus resistance against the air flowing from the fan to the air outlet can be reduced.

In one or more embodiments, the casing may comprise a body casing including one of the air inlet and the air outlet; and a cover member including other of the air inlet and the air outlet and configured to be detachably attached to the body casing. The accommodating space may be defined by the body casing and the cover member.

The configuration above facilitates maintenance of the accommodating space since the cover member can be detached from the body casing.

First Embodiment

Referring to FIGS. 1 to 19, a charger 2 according to a first embodiment will be described. As illustrated in FIG. 1, the charger 2 is a battery-related device for charging battery packs BP. In a variant, a battery-related device, such as a battery checker for checking the performance of the battery packs BP, may be selected. The battery packs BP are power sources for electric power supply to an electric device (not illustrated) such as an electric tool, an electric working machine, etc. The battery packs BP are configured to be detachably attached to the electric device. The charger 2 according to the present embodiment is configured to charge the battery packs BP detached from the electric device. Hereinbelow, when the charger 2 is placed on a placement plane, a direction perpendicular to the placement plane will be termed an up-down direction, a direction defined by projecting directions in which the battery packs BP are slid with respect to the charger 2 (directions A, B) onto the placement plane will be termed a front-rear direction, and a direction perpendicular to the up-down direction and the front-rear direction will be termed a left-right direction.

Figure 2:
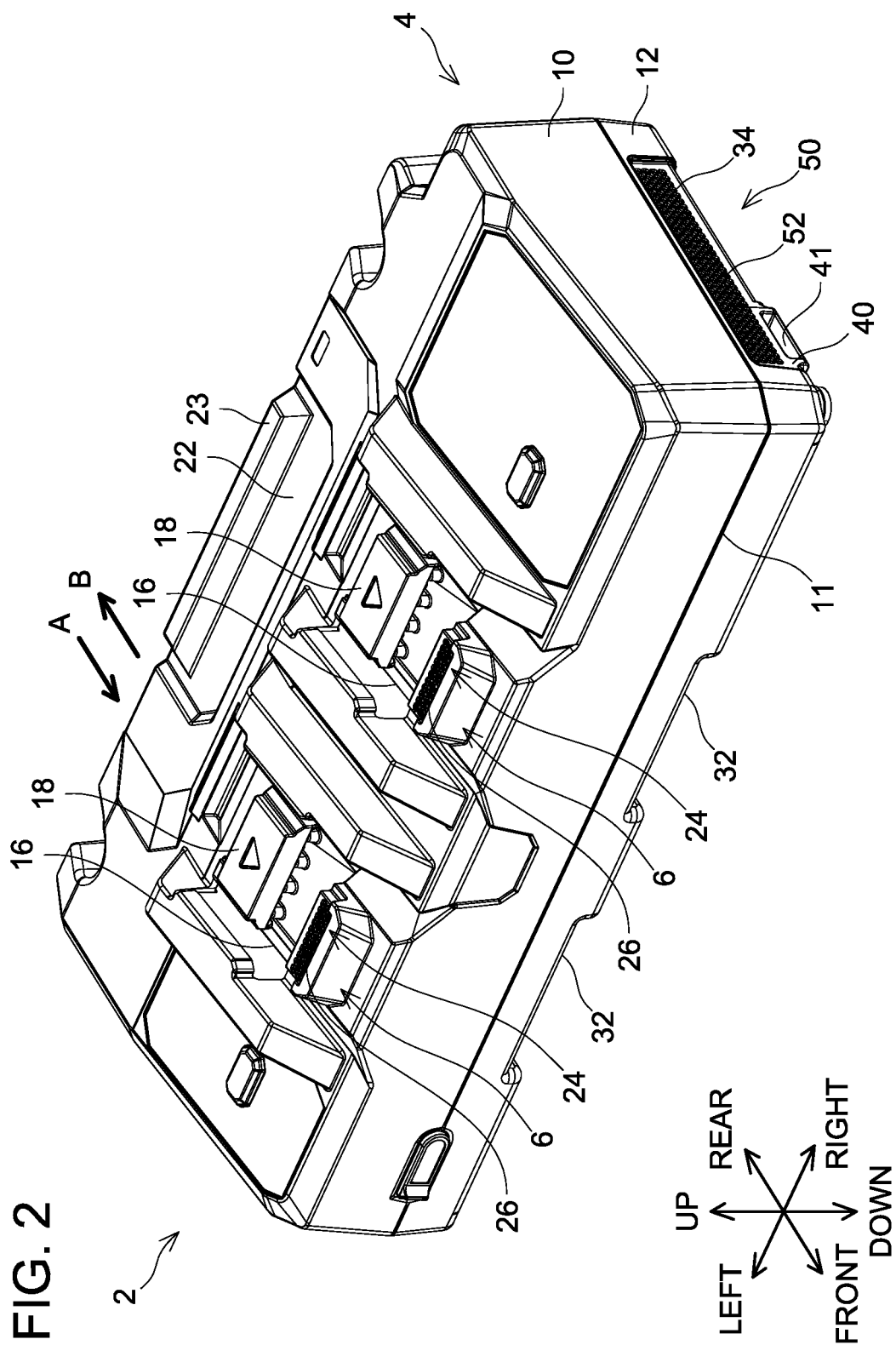
FIG. 2 is a perspective view of the charger 2 according to the first embodiment, as viewed from the upper side.

As illustrated in FIG. 2, the charger 2 comprises a casing 4 and battery attachment parts 6. The casing 4 comprises an upper casing 10 and a lower casing 12. The lower casing 12 is configured to be combined with the upper casing 10. The upper casing 10 and the lower casing 12 are fixed together with bolts (not illustrated). When the charger 2 is placed on the placement plane, a lower surface of the lower casing 12 faces the placement plane.

As illustrated in FIG. 2, two battery attachment parts 6 are disposed at the upper casing 10. The battery attachment parts 6 are arranged side-by-side in the left-right direction. The battery attachment parts 6 slidably receive the battery packs BP along the direction A, B in FIG. 2. The direction A indicates a direction in which the battery packs BP are attached to the battery attachment parts 6, and the direction B indicates a direction in which the battery packs BP are detached from the battery attachment parts 6. At the battery attachment parts 6, covers 18 are attached to edge portions of a pair of cover attachment openings 16 (FIG. 2 illustrates only one of the cover attachment openings 16). When the battery packs BP are attached to the battery attachment parts 6, the covers 18 are pushed in the direction A by the battery packs BP. In this instance, the battery packs BP are electrically connected to connecting terminals (not illustrated) of the battery attachment parts 6, which are an example of electric component. The covers 18 are biased in the direction B by biasing members (not illustrated), and when the battery packs BP are detached from the battery attachment parts 6, the covers 18 are pushed in the direction B. In this instance, the covers 18 cover the connecting terminals of the battery attachment parts 6.

An upper outer surface of the upper casing 10 includes a recess 22 and a projection 23. The recess 22 is defined in a rear portion of the upper outer surface of the upper casing 10.

The projection 23 is disposed in the recess 22. The projection 23 projects upward from a bottom surface of the recess 22. The projection 23 extends in the left-right direction.

Cooling air inlet ports 24 are disposed on the upper outer surface of the upper casing 10, corresponding to the battery attachment parts 6, respectively. The cooling air inlet ports 24 are disposed in front portions of the battery attachment parts 6. Each of the cooling air inlet ports 24 includes a plurality of cooling air inlets 26. The plurality of cooling air inlets 26 communicates the inside of the casing 4 with the outside thereof. The cooling air inlets 26 are spaced from each other in the front-rear direction and the left-right direction. The opening shape of the cooling air inlets 26 is substantially square. This can suppress entry of foreign matters into the casing 4 through the plurality of cooling air inlets 26 as compared with a configuration in which the opening shape of the cooling air inlets 26 is an elongated hole.

Figure 3:
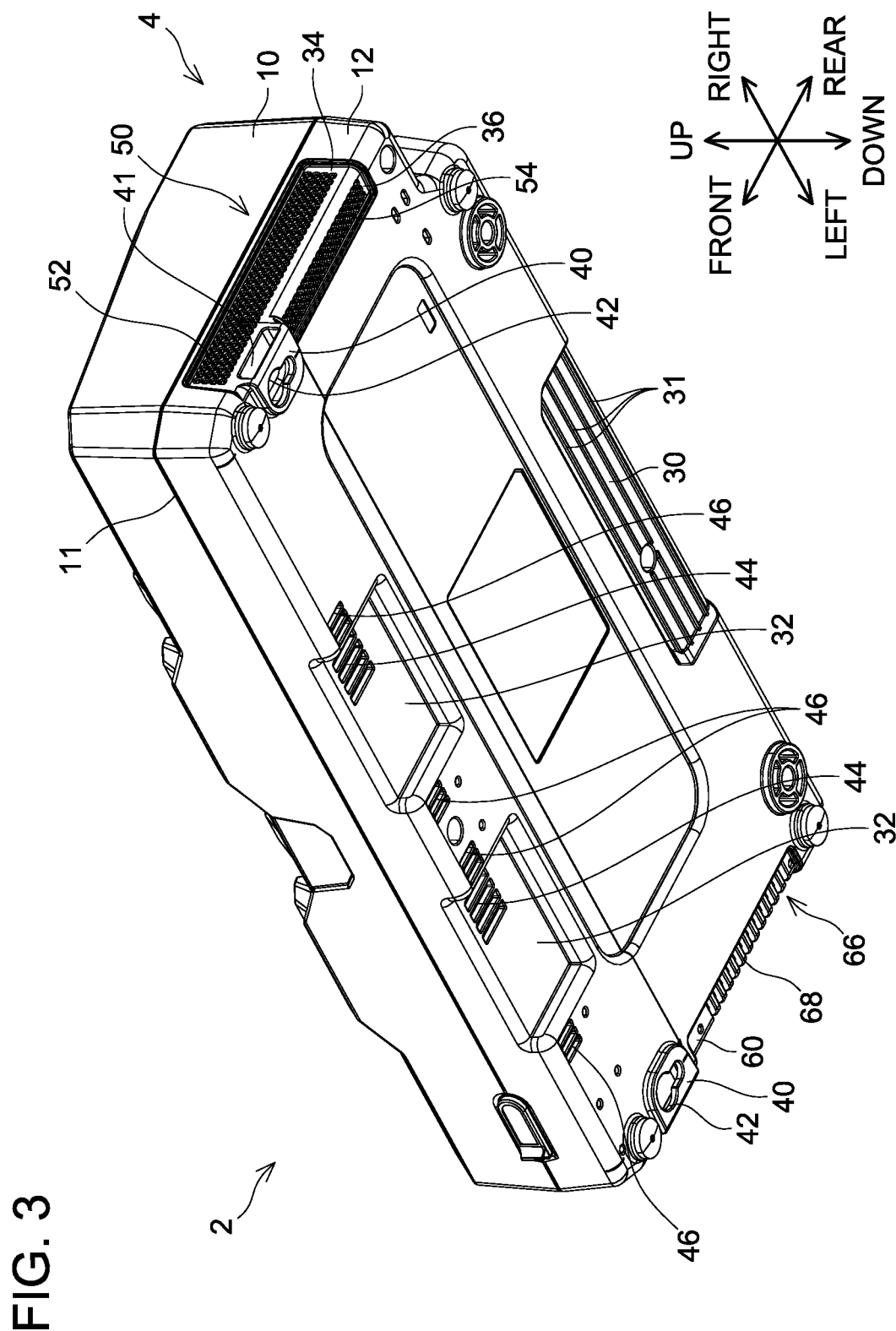
FIG. 3 is a perspective view of the charger 2 according to the first embodiment, as viewed from the lower side.

As illustrated in FIG. 3, the lower casing 12 includes a recess 30, a plurality of projections 31 (four in the present embodiment), and recesses 32. The recess 30 is disposed at a rear portion of a lower outer surface of the casing 12. The recess 30 is positioned to overlap the recess 22 of the upper casing 10 as the charger 2 is viewed from above in planar view. The plurality of projections 31 is disposed in the recess 30. The projections 31 project downward from a bottom surface of the recess 30. The projections 31 are spaced from each other in the front-rear direction. A user can easily grab the charger 2 by gripping the recess 22 and the recess 30 with one of his/her hands. Further, the user can stably grab the charger 2 by hooking fingers of his/her hand on the projection 23 in the recess 22 and the projections 31 in the recess 30.

The recesses 32 are disposed corresponding to the battery attachment parts 6 of the upper casing 10, respectively. The recesses 32 are disposed at a front portion of the lower outer surface of the lower casing 12. The recesses 32 are disposed at the same position in the front-rear direction.

A recess 34 is defined in a right outer surface of the lower casing 12. The recess 34 extends in the front-rear direction. A recess 36 is defined in the lower outer surface of the lower casing 12. The recess 36 is disposed at a right end of the lower casing 12. The recess 36 extends in the front-rear direction. The recess 36 is connected to the recess 34.

The charger 2 further comprises wall attachment parts 40. The wall attachment parts 40 are disposed at a left end and the right end of the lower outer surface of the lower casing 12. The wall attachment parts 40 are formed integrally with the lower casing 12. The wall attachment parts 40 each comprise a side hole 41 and an engagement hole 42. The side hole 41 is open rightward in a side portion of the wall attachment part 40. The engagement holes 42 penetrate bottom portions of the wall attachment parts 40 in the up-down direction. The engagement holes 42 are engageable with fixed objects such as screws fixed to a wall. The charger 2 can be fixed to a wall by the engagement holes 42 engaging with the fixed objects. In this instance, a bottom surface of the charger 2 is along the wall.

Cooling air outlets 44 and drainage outlets 46 are defined in the lower outer surface of the lower casing 12. The cooling air outlets 44 are disposed at a front portion of the lower casing 12. The cooling air outlets 44 are disposed in the recesses 32, respectively. The cooling air outlets 44 communicate the inside of the casing 4 with the outside thereof.

The drainage outlets 46 are disposed at the front portion of the lower casing 12. The drainage outlets 46 are disposed to sandwich each recess 32 in the left-right direction. The drainage outlets 46 communicate the inside of the casing 4 with the outside thereof.

The lower casing 12 includes an air inlet port 50. The air inlet port 50 is adjacent to the right wall attachment part 40. The air inlet port 50 includes a plurality of first air inlets 52 and a plurality of second air inlets 54. The plurality of first air inlets 52 is separate from the plurality of second air inlets 54. The plurality of first air inlets 52 is disposed in the recess 34 in the right outer surface of the lower casing 12. The first air inlets 52 are spaced from each other in the up-down direction and the front-rear direction. The plurality of first air inlets 52 penetrates the right outer surface of the lower casing 12 in the left-right direction. The plurality of first air inlets 52 is open toward the inside of the casing 4 from a side portion (i.e., right side) of the right outer surface of the casing 12. The plurality of second air inlets 54 is disposed in the recess 36 in the lower outer surface of the lower casing 12. The opening shape of the plurality of second air inlets 54 is the same as that of the plurality of first air inlets 52. The second air inlets 54 are spaced from each other in the front-rear direction and the left-right direction. The plurality of second air inlets 54 is disposed rearward of the engagement hole 42. The plurality of second air inlets 54 penetrates the lower outer surface of the lower casing 12 in the up-down direction. The number of the second air inlets 54 is smaller than the number of the first air inlets 52.

Figure 4:
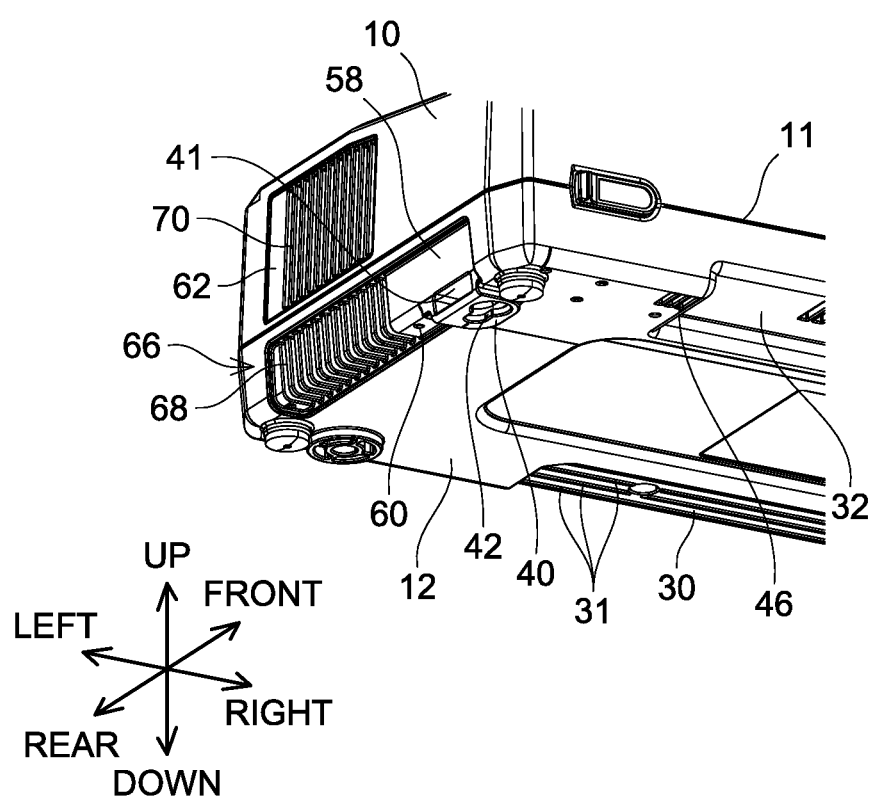
FIG. 4 is an enlarged view of the vicinity of a left side surface of the charger 2 according to the first embodiment.

As illustrated in FIG. 4, a recess 58 and a recess 60 are further defined in the lower casing 12, and a recess 62 is further defined in a left outer surface of the upper casing 10. The recess 58 is defined in a left outer surface of the lower casing 12. The recess 58 extends in the front-rear direction. The recess 60 is defined in the lower outer surface of the lower casing 12. The recess 60 is disposed at the left end of the lower casing 12. The recess 60 extends in the front-rear direction. The recess 60 is connected to the recess 58.

The casing 4 comprises an air outlet port 66. The air outlet port 66 includes a plurality of first air outlets 68 and a plurality of second air outlets 70. The plurality of first air outlets 68 is disposed across the left outer surface and the lower outer surface of the lower casing 12 and is disposed across the recess 58 and the recess 60. The shape of the first air outlets 68 is a substantially L-shape. The first air outlets 68 are arranged in the front-rear direction. The plurality of second air outlets 70 is disposed in the recess 62 in the left outer surface of the upper casing 10. The opening shape of the second air outlets 70 is an elongated hole extending in the up-down direction. A width of the second air outlet 70 in the front-rear direction is the same as a width of the first air outlet 68 in the front-rear direction. The second air outlets 70 are arranged in the front-rear direction. The plurality of second air outlets 70 is separate from the plurality of first air outlets 68. The number of the second air outlets 70 is equal to the number of the first air outlets 68. The number of the second air outlets 70 is smaller than the number of first air inlets 52 and the number of the second air inlets 54 of the air inlet port 50.

Figure 5:
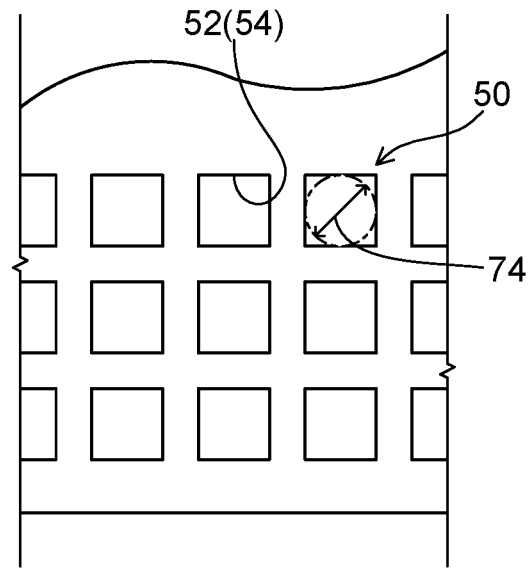
FIG. 5 is a schematic diagram of an air inlet port 50 of the charger 2 according to the first embodiment.
Figure 6:
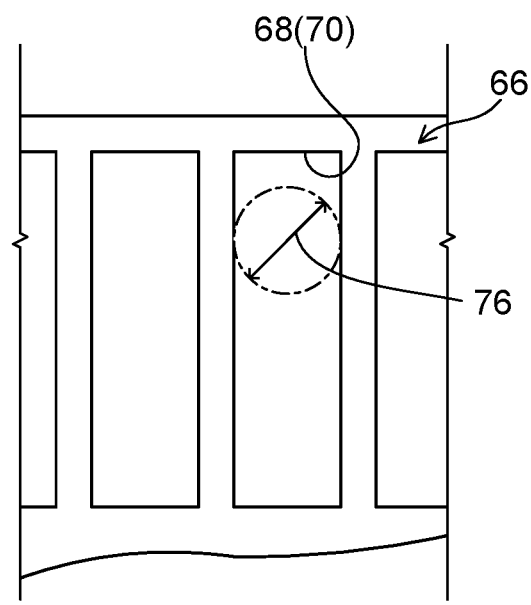
FIG. 6 is a schematic diagram of an air outlet port 66 of the charger 2 according to the first embodiment.

As illustrated in FIGS. 5 and 6, an area of the first air inlet 52 is smaller than an area of the first air outlet 68 and an area of the second air outlet 70. Further, an inscribed circle 74 of the first air inlet 52 is smaller than an inscribed circle 76 of the first air outlet 68 and an inscribed circle 76 of the second air outlet 70. Similarly, an area of the second air inlet 54 is smaller than the area of the first air outlet 68 and the area of the second air outlet 70. Further, an inscribed circle 74 of the second air inlet 54 is smaller than the inscribed circle 76 of the first air outlet 68 and the inscribed circle 76 of the second air outlet 70. Thus, when air is taken into the casing 4 through the air inlet port 50 due to rotation of a first fan 86, which will be described later, entry of foreign matters and/or liquid into the casing 4 through the plurality of first air inlets 52 and the plurality of second air inlets 54 can be suppressed, and foreign matters and/or liquid that have entered the casing 4 can be easily discharged through the plurality of first air outlets 68 and the plurality of second air outlets 70.

Figure 7:
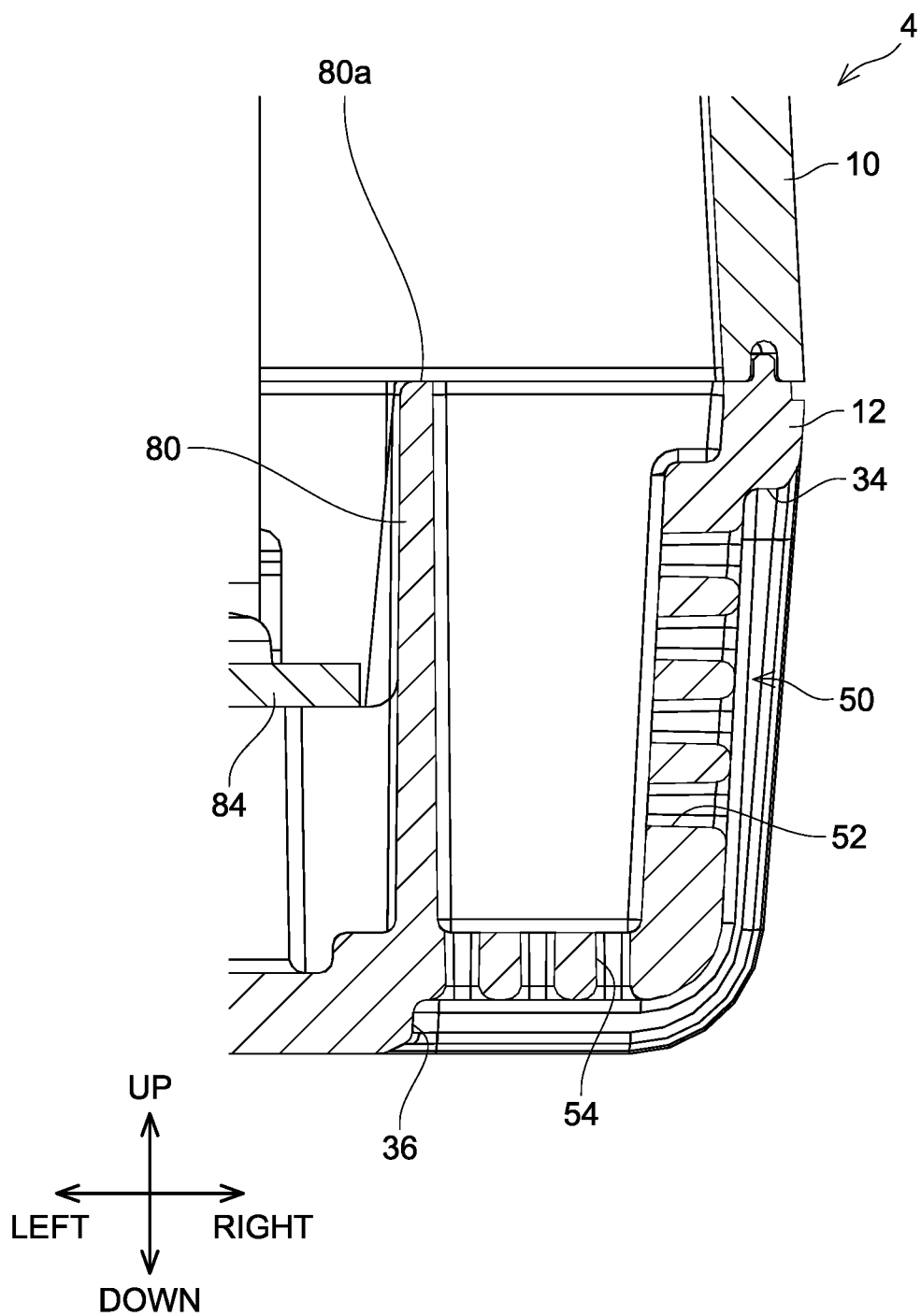
FIG. 7 is a cross-sectional view in the vicinity of the air inlet port 50 of the charger 2 according to the first embodiment.
Figure 8:
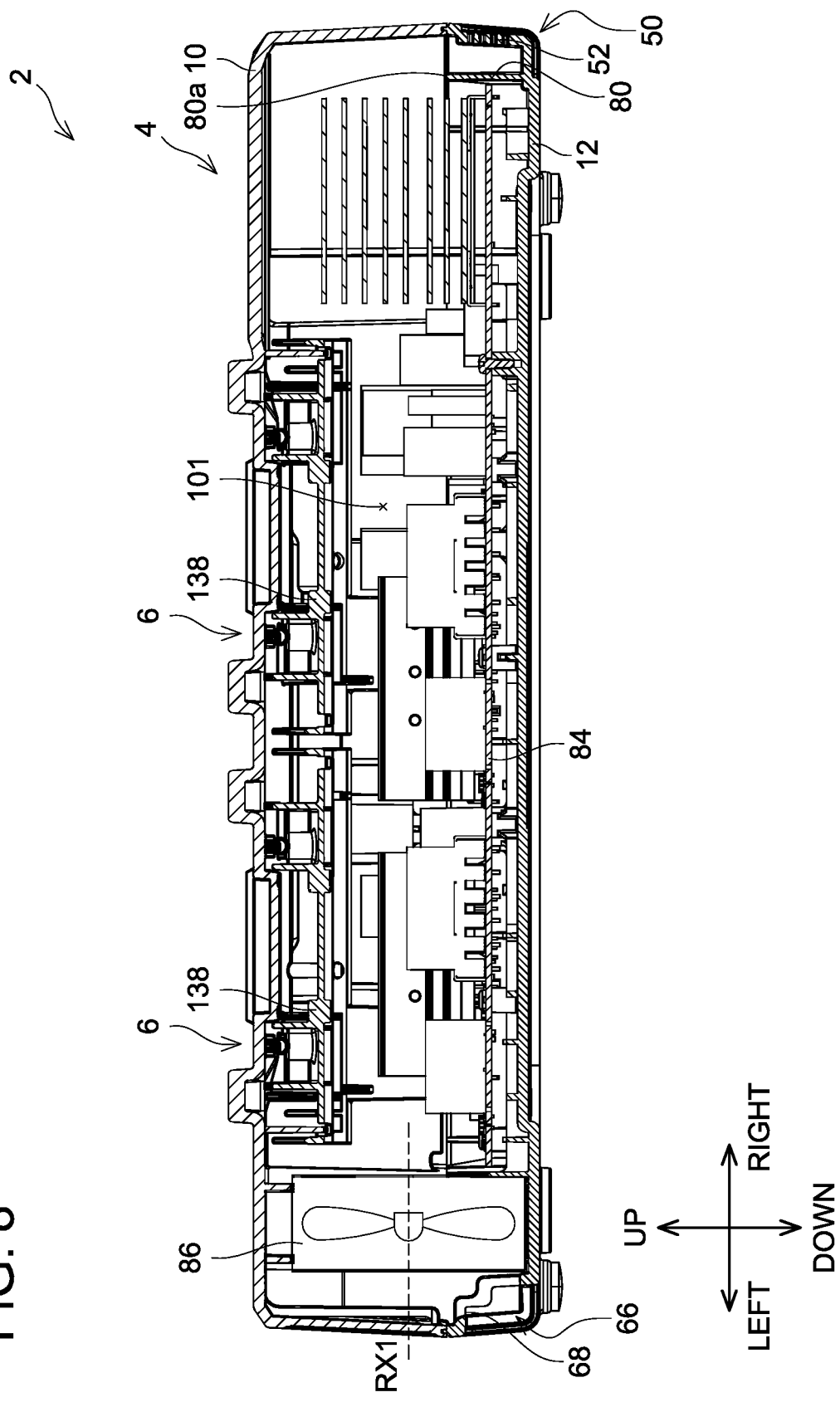
FIG. 8 is a cross-sectional view of the entire charger 2 according to the first embodiment.

As illustrated in FIG. 8, the charger 2 comprises a first rib 80. The first rib 80 is disposed near the air inlet port 50 within the casing 4. The first rib 80 extends upward from a lower inner surface of the lower casing 12. As illustrated in FIG. 7, a distal end 80a (i.e., an upper end) of the first rib 80 is positioned above the plurality of first air inlets 52. Further, a position of the distal end 80a of the first rib 80 is at the same height as a position of a mating face 11 of the upper casing 10 and the lower casing 12.

Figure 9:
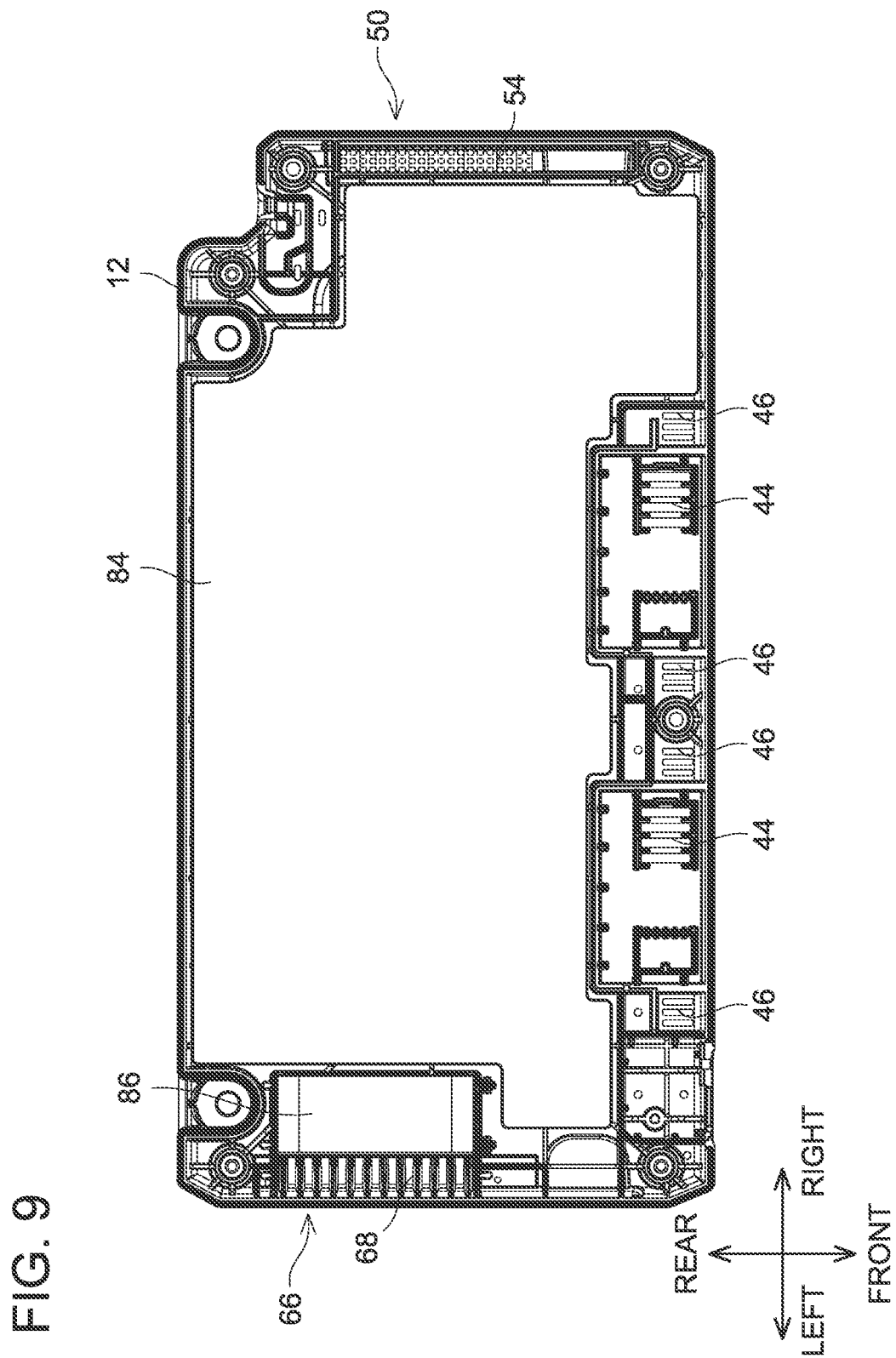
FIG. 9 is a top view of a lower casing 12 with a circuit board 84 according to the first embodiment attached thereto.

As illustrated in FIGS. 8 and 9, the charger 2 further comprises a circuit board 84 and the first fan 86. The circuit board 84 is disposed in the casing 4. The circuit board 84 is attached to the lower casing 12. As illustrated in FIG. 9, the circuit board 84 has a longitudinal axis extending in the left-right direction.

As illustrated in FIG. 8, the first fan 86 is disposed in the casing 4 between the circuit board 84 and the air outlet port 66. The first fan 86 is adjacent to the air outlet port 66 on the right side thereof. The first fan 86 is an axial fan. In a variant, the first fan 86 may be another type of fan, for example, may be a centrifugal fan. The first fan 86 is disposed such that a rotation axis RX1 of the first fan 86 extends in the left-right direction. Thus, a region required for the placement of the first fan 86 can be reduced in the left-right direction.

Operation of the first fan 86 is controlled by a control unit (not illustrated) mounted on the circuit board 84. When the first fan 86 rotates, an air flow from the air inlet port 50 toward the air outlet port 66 is generated. As a result, air outside of the casing 4 is taken into the casing 4 through the air inlet port 50 and flows along the longitudinal axis of the circuit board 84. In this instance, foreign matters and/or liquid contained in the air collide into the first rib 80, thus the foreign matters and/or liquid are less likely to cross over the first rib 80 to the circuit board 84 side. The foreign matters and/or liquid are discharged to the outside of the casing 4 from the plurality of second air inlets 54. The air flowing along the longitudinal direction of the circuit board 84, together with foreign matters and/or liquid that have crossed over the first rib 80 to the circuit board 84 side, passes through the first fan 86 and is discharged to the outside of the casing 4 from the air outlet port 66.

Figure 10:
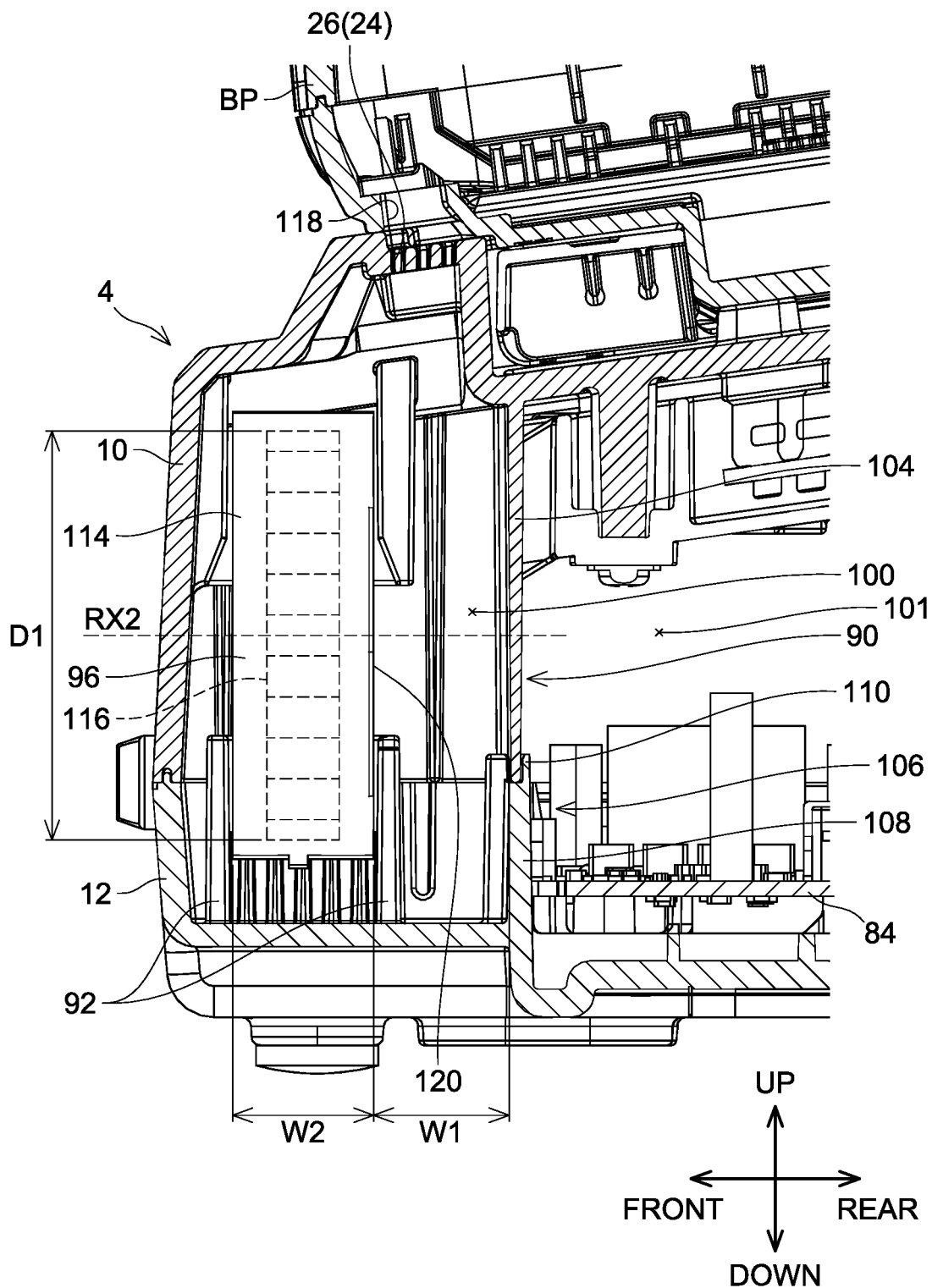
FIG. 10 is a cross-sectional view in the vicinity of a first accommodating space 100 of the charger 2 according to the first embodiment with the battery packs BP attached thereto.
Figure 11:
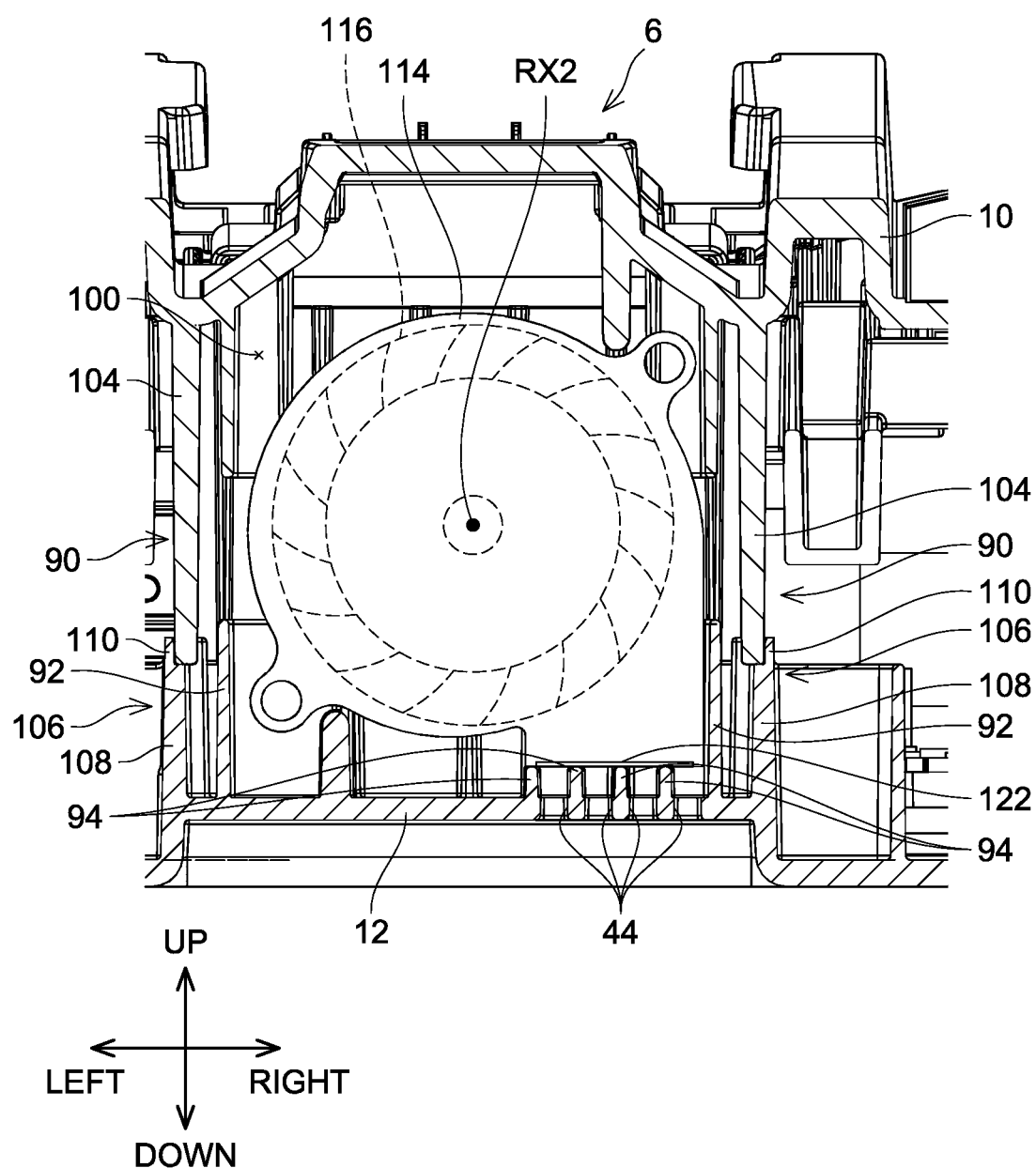
FIG. 11 is a cross-sectional view in the vicinity of a centrifugal fan 96 of the charger 2 according to the first embodiment.
Figure 12:
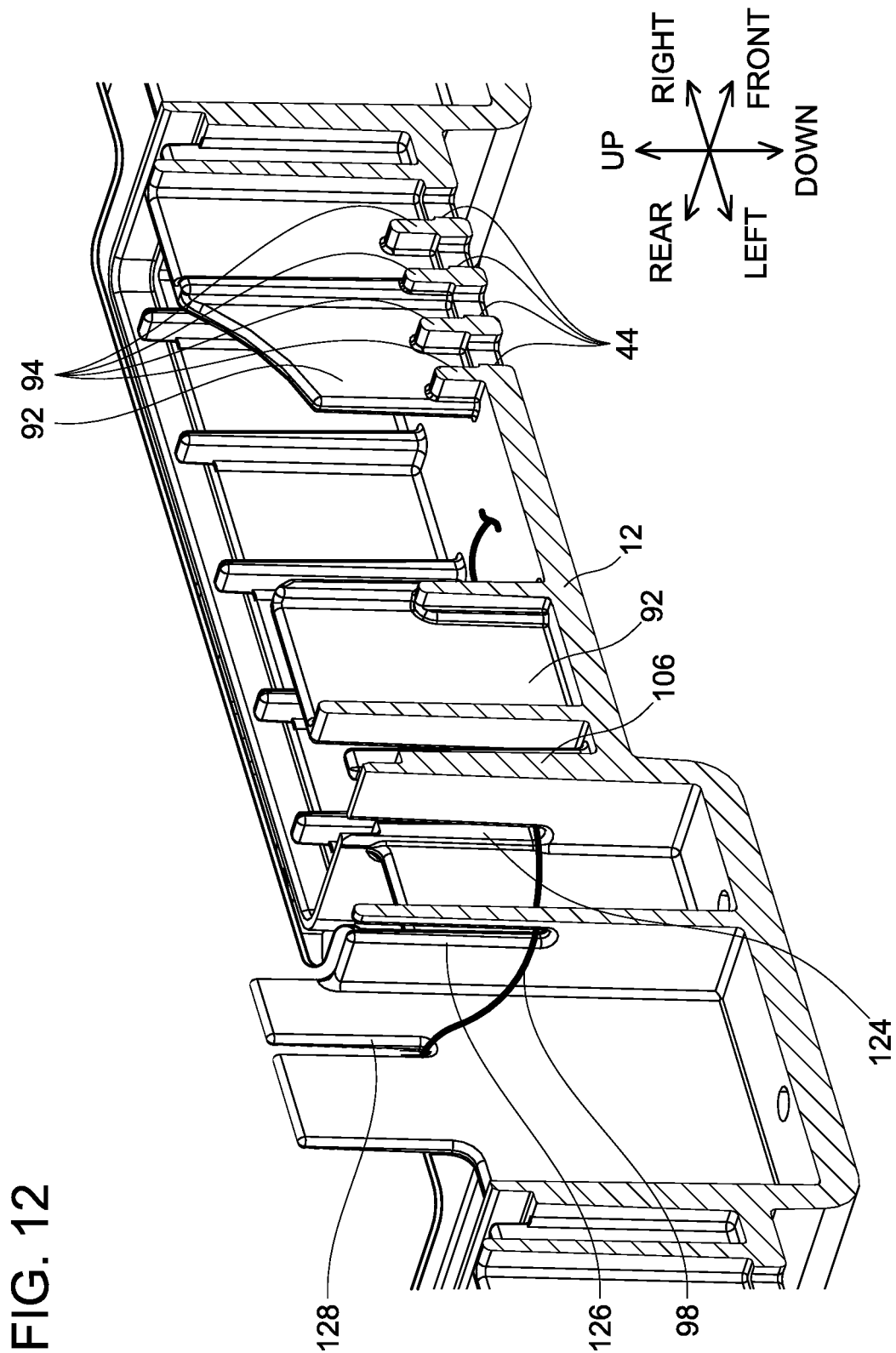
FIG. 12 is a cross-sectional view in the vicinity of cooling air outlets 44 of the lower casing 12 according to the first embodiment.

As illustrated in FIG. 10, the charger 2 comprises, for each of the battery attachment parts 6, an inner wall 90, support walls 92, second ribs 94 (see FIGS. 11 to 13), a centrifugal fan 96, and a fan connection line 98 (see FIG. 12). The inner wall 90 defines a first accommodating space 100 within the casing 4. The first accommodating space 100 is separate from a second accommodating space 101 in which the circuit board 84 is disposed within the casing 4. The first accommodating space 100 communicates with the outside of the casing 4 through the cooling air inlets 26 of the upper casing 10 and also through the cooling air outlets 44 of the lower casing 12.

The inner wall 90 comprises an upper inner wall 104 and a lower inner wall 106. The upper inner wall 104 extends downward from an upper inner surface of the upper casing 10. The lower inner wall 106 comprises a first lower inner wall 108 and a second lower inner wall 110. The first lower inner wall 108 extends upward from the lower inner surface of the lower casing 12. The second lower inner wall 110 extends upward from an upper end of the first lower inner wall 108. When the upper casing 10 and the lower casing 12 are combined together, a lower end of the upper inner wall 104 contacts the upper end of the first lower inner wall 108 and an upper end of the second lower inner wall 110 is positioned above the lower end of the upper inner wall 104. Further, in the front-rear direction, the second lower inner wall 110 overlaps the upper inner wall 104 and is positioned closer to the second accommodating space 101 than the upper inner wall 104 is. A labyrinth structure is formed by the upper inner wall 104 and the lower inner wall 106. Thus, even when liquid (e.g., water) enters the first accommodating space 100, the liquid is suppressed from reaching the second accommodating space 101 from the first accommodating space 100.

As illustrated in FIGS. 10 and 11, the support walls 92 extend upward from the lower inner surface of the lower casing 12. The support walls 92 are disposed in the first accommodating space 100. The support walls 92 support the centrifugal fan 96 and suppress the centrifugal fan 96 from moving in the front-rear direction and the left-right direction.

As illustrated in FIG. 11, the second ribs 94 extend upward from the lower inner surface of the lower casing 12. The second ribs 94 are adjacent to the cooling air outlets 44. The second ribs 94 and the cooling air outlets 44 are arranged alternately in the left-right direction. The second ribs 94 contact the centrifugal fan 96 at their upper ends. Thus, the second ribs 94 support the centrifugal fan 96. Further, the centrifugal fan 96 is thus spaced from the lower inner surface of the lower casing 12.

The centrifugal fan 96 is, for example, a squirrel cage fan. The centrifugal fan 96 is disposed in the first accommodating space 100. As illustrated in FIG. 10, the centrifugal fan 96 is disposed forward of the lower inner wall 106. The centrifugal fan 96 is disposed forward of the cooling air inlets 26. Further, the cooling air inlets 26 are disposed closer to the centrifugal fan 96 than the inner wall 90 is. The centrifugal fan 96 is disposed such that a rotation axis RX2 of the centrifugal fan 96 extends in the front-rear direction. Thus, a region required for the placement of the centrifugal fan 96 can be reduced.

Figure 13:
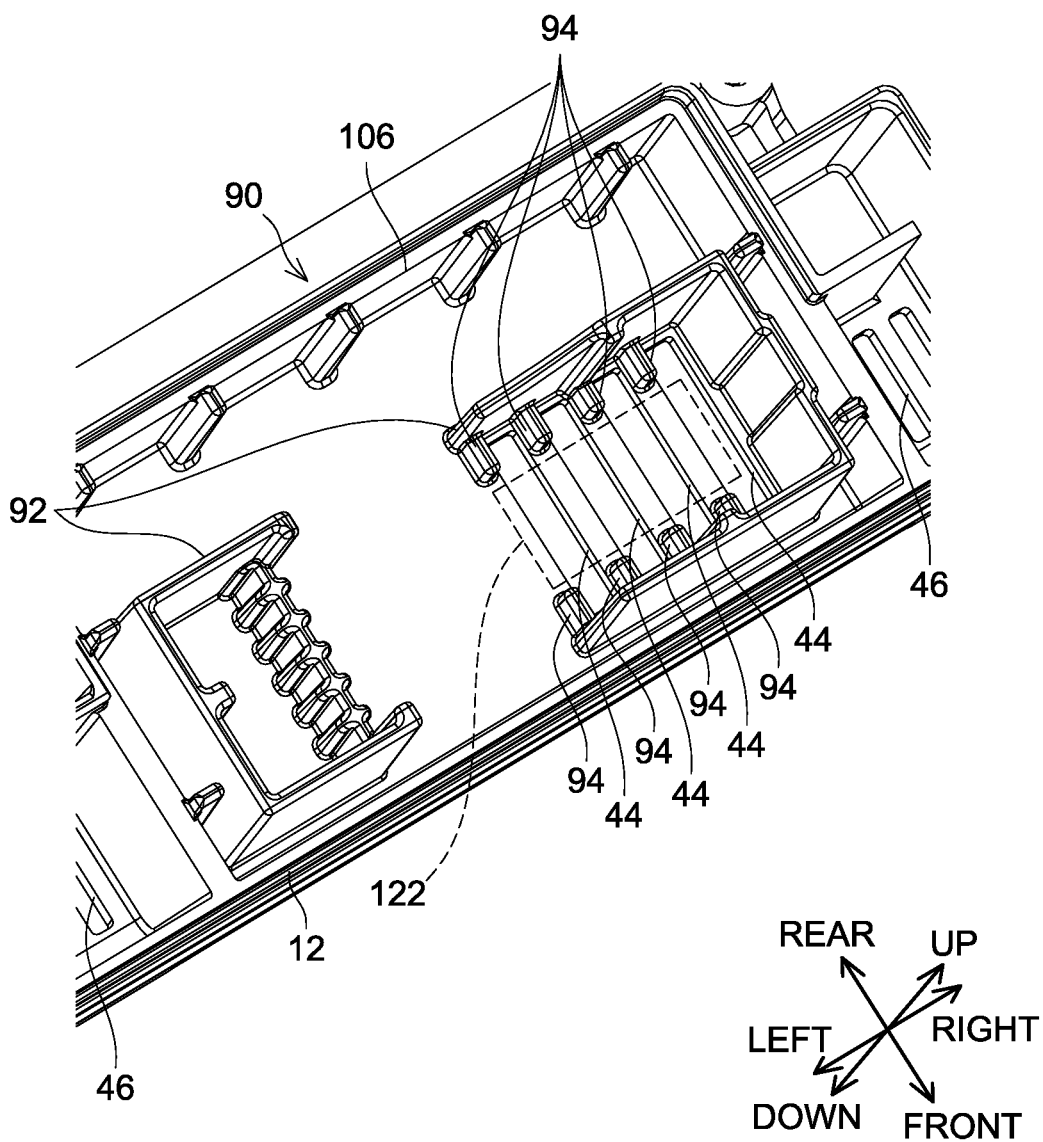
FIG. 13 is a perspective view in the vicinity of second ribs 94 of the lower casing 12 according to the first embodiment.

The centrifugal fan 96 comprises a fan casing 114 and a blade unit 116. The fan casing 114 is disposed in the first accommodating space 100 such that a width W1 between the inner wall 90 and the fan casing 114 in the front-rear direction is equal to or less than 150% of a width W2 of the fan casing 114 in the front-rear direction. In a variant, the width W1 between the inner wall 90 and the fan casing 114 in the front-rear direction may be equal to or less than 100% of the width W2 of the fan casing 114 in the front-rear direction. The fan casing 114 comprises a fan air inlet 120 and a fan air feed port 122 (see FIG. 11). The fan air inlet 120 faces the inner wall 90. The fan air inlet 120 is open forward. As illustrated in FIG. 11, the fan air feed port 122 is open downward. The cooling air outlets 44 are disposed below the fan air feed port 122. The fan air feed port 122 faces the cooling air outlets 44. As illustrated in FIG. 13, the upper ends of the second ribs 94 are disposed at a peripheral portion of the fan air feed port 122 and contact thereto, be fan air feed port 122 is not blocked by the second ribs 94.

The blade unit 116 is rotatably supported within the fan casing 114. As illustrated in FIG. 10, the blade unit 116 is designed such that the width W1 between the inner wall 90 and the fan casing 114 in the front-rear direction is equal to or less than 50% of a diameter D1 of the blade unit 116. In a variant, the blade unit 116 may be designed such that the width W1 between the inner wall 90 and the fan casing 114 in the front-rear direction is equal to or less than 25% of the diameter D1 of the blade unit 116.

When the blade unit 116 of the centrifugal fan 96 rotates, air outside of the casing 4 is taken into the first accommodating space 100 through the cooling air outlets 44 and is then taken into the fan casing 114 through the fin air inlet 120. Thereafter, the air is fed downward from the fan air feed port 122 by the rotation of the blade unit 116 and is discharged to the outside of the casing 4 through the cooling air outlets 44. Since the fan air feed port 122 is not blocked by the second ribs 94, an increase in noise of the centrifugal fan 96 caused by the air colliding into the second ribs 94 can be suppressed.

In the state where the battery pack BP is attached to the battery attachment part 6, a battery air outlet 118 of the battery pack BP is positioned immediately above the cooling air inlets 26. Thus, when the blade unit 116 of the centrifugal fan 96 rotates, air inside of the battery pack BP is taken into the first accommodating space 100 through the cooling air inlets 26. This generates an air flow within the battery pack BP, thereby cooling the battery pack BP.

The fan connection line 98 illustrated in FIG. 12 electrically connects the centrifugal fan 96 to the circuit board 84. In FIG. 12, depiction of the centrifugal fan 96 and the circuit board 84 is omitted for easier understanding of the arrangement of the fan connection line 98. The fan connection line 98 is held by a first holding groove 124, a second holding groove 126, and a third holding groove 128. The first holding groove 124 is defined in the lower inner wall 106, and the second holding groove 126 and the third holding groove 128 are defined in the lower casing 12 near the lower inner wall 106. The fan connection line 98 passes through the first holding groove 124, the second holding groove 126, and the third holding groove 128 in this order, from the centrifugal fan 96 toward the circuit board 84. In the up-down direction, a lower end of the second holding groove 126 is positioned above a lower end of the first holding groove 124, and a lower end of the third holding groove 128 is positioned above the lower end of the second holding groove 126. Owing to this configuration, even when liquid (e.g., water) enters the first accommodating space 100 and adheres to the fan connection line 98, the liquid will not follow the fan connection line 98 in a direction from the first holding groove 124 to the second holding groove 126 nor in a direction from the second holding groove 126 to the third holding groove 128. Thus, the liquid is suppressed from reaching the circuit board 84.

Figure 14:
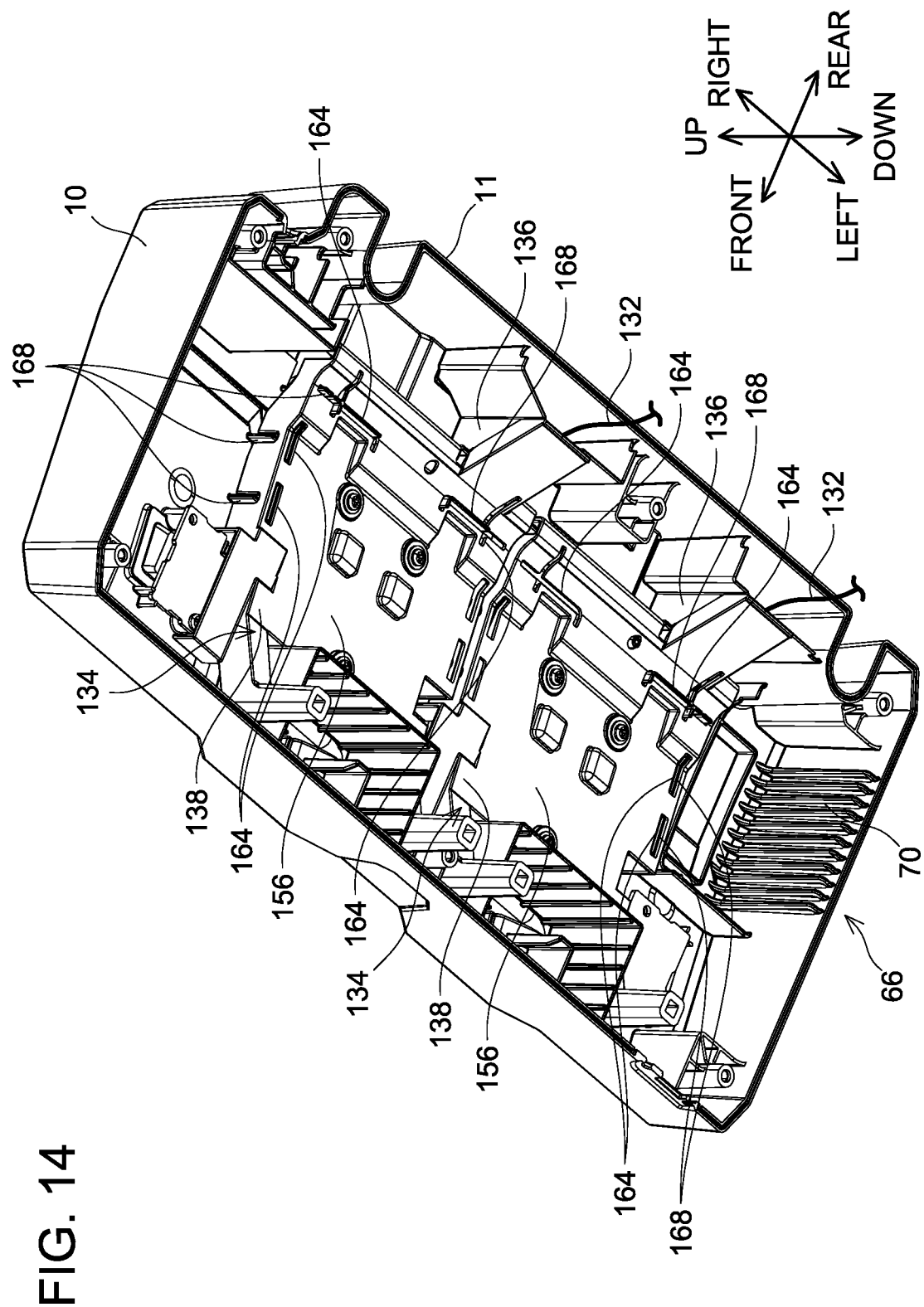
FIG. 14 is a perspective view of an upper casing 10 with second duct portions 138 according to the first embodiment attached thereto, as viewed from the lower side.

As illustrated in FIG. 14, the charger 2 further comprises, for each of the battery attachment parts 6, a first connection line 132 and a duct 134. The first connection lines 132 electrically connect the connecting terminals (not illustrated) of the battery attachment parts 6 to the circuit board 84. The first connection lines 132 extend from the upper casing 10 to the lower casing 12.

Figure 16:
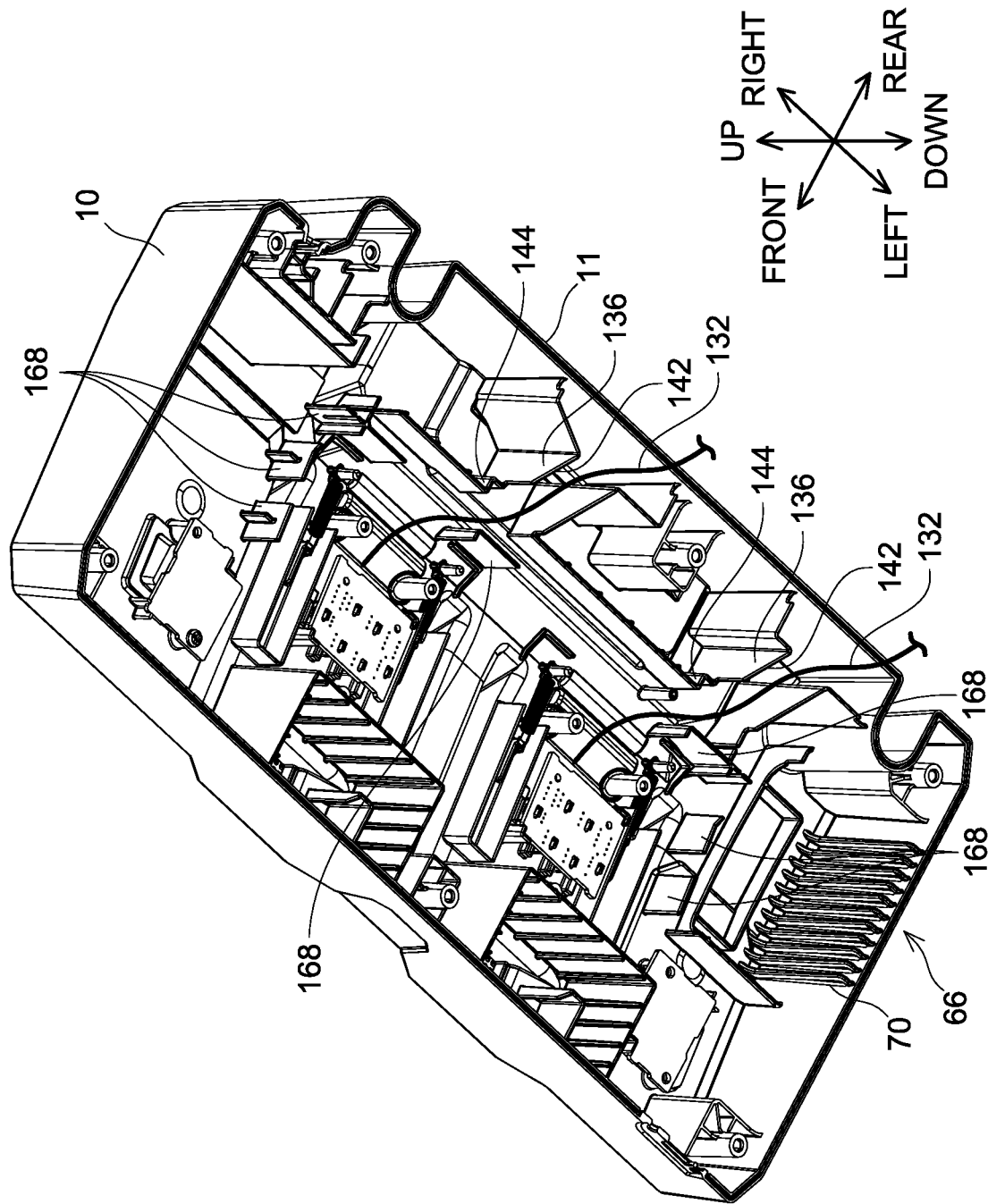
FIG. 16 is a perspective view of the upper casing 10 according to the first embodiment, as viewed from the lower side.

The ducts 134 guide the first connection lines 132 from the upper casing 10 to the lower casing 12. The ducts 134 each comprise a first duct portion 136 and a second duct portion 138. As illustrated in FIG. 16, the first duct portions 136 are formed integrally with the upper casing 10. The first duct portions 136 are disposed at a rear portion of the upper casing 10. The first duct portions 136 extend from the upper inner surface and a rear inner surface of the upper casing 10. The first duct portions 136 extend, from the upper casing 10 toward the lower casing 12, up to near the mating face 11 of the upper casing 10 and the lower casing 12. The first duct portions 136 each include an opening 142. The openings 142 are open to allow insertion and removal of the first connection lines 132. Further, the first duct portions 136 each include a deterrent structure 144. The deterrent structures 144 are formed by concaving front corners of the first duct portions 136 such that the first duct portions 136 become wider from the rear toward the front. This facilitates insertion of the first connection lines 132 into the openings 142, and the first connection lines 132 are suppressed from hanging over the first duct portions 136. Thus, visual observation on whether the first connection lines 132 are properly arranged or not can be facilitated. Further, the first connection lines 132 can be suppressed from being caught between the second duct portions 138 and the upper casing 10. As a result, a part of the first connection lines 132 is suppressed from going out from the first duct portions 136 through the openings 142 of the first duct portions 136.

Figure 15:
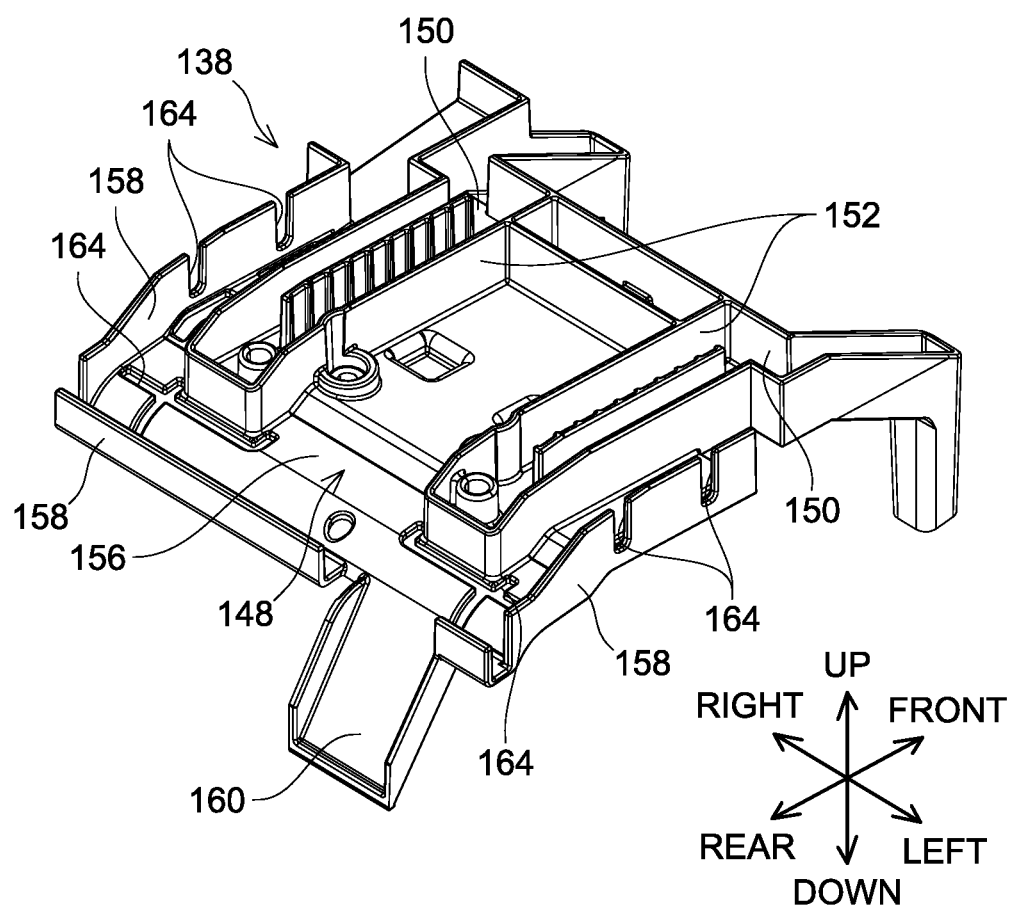
FIG. 15 is a perspective view of the second duct portion 138 according to the first embodiment.

The second duct portions 138 are detachably attached to the upper casing 10. As illustrated in FIG. 15, the second duct portion 138 comprises a first guide 148, two second guides 150, and a partition 152. The first guide 148, the two second guides 150, and the partition 152 are formed integrally with each other. The first guide 148 comprises a base 156, a lateral 158, and an overhang 160. The base 156 faces the upper inner surface of the upper casing 10 when the second duct portion 138 is attached to the upper casing 10. The connection of the first connection line 132 with the battery attachment part 6 is disposed between the base 156 and the upper casing 10. The lateral 158 extends from a peripheral edge of the base 156 in a substantially vertical direction with respect to the base 156. When the base 156 is attached to the upper casing 10, the lateral 158 suppresses the first connection line 132 from exiting from between the upper casing 10 and the base 156.

Figure 17:
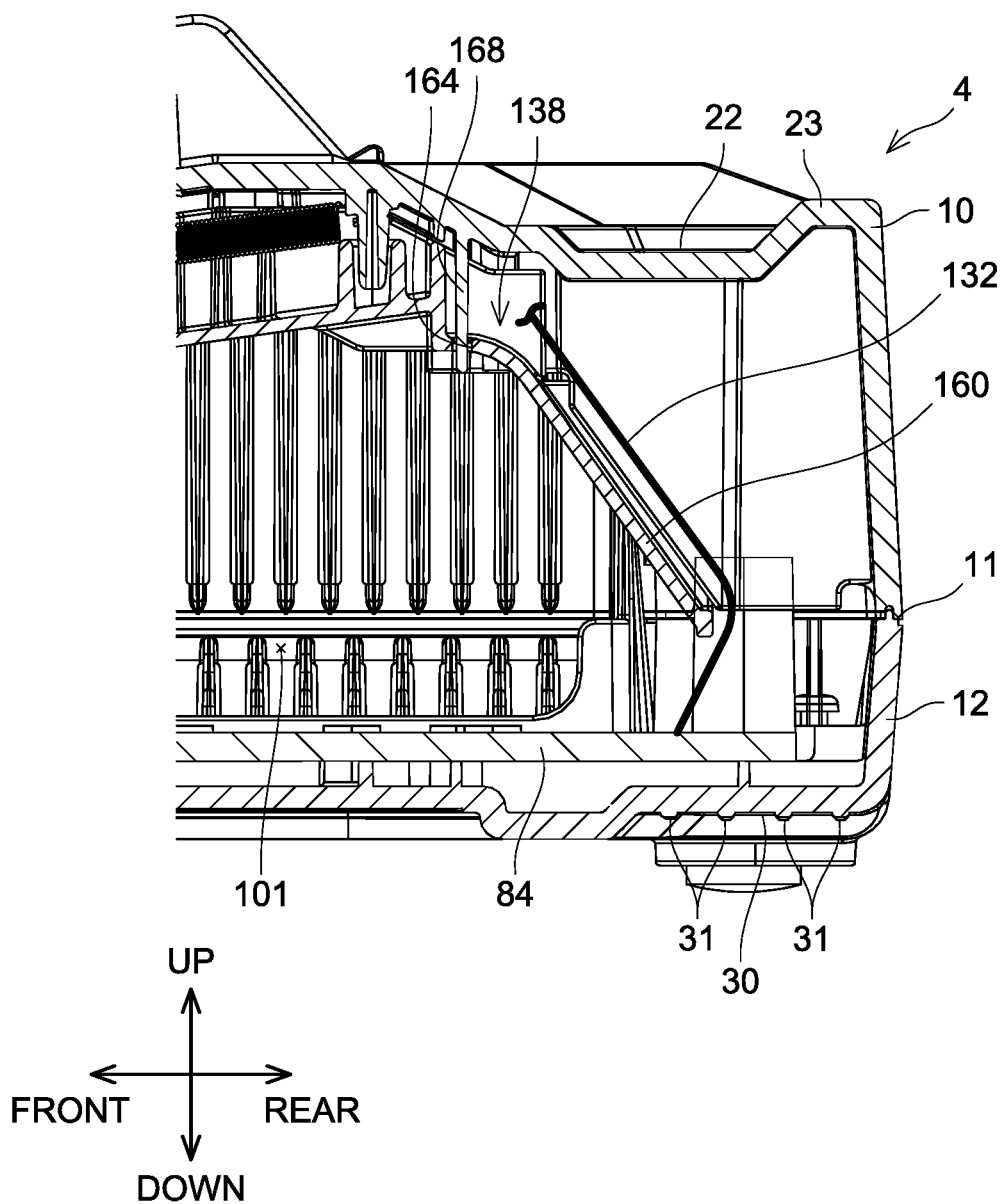
FIG. 17 is a cross-sectional view in the vicinity of the second duct portion 138 according to the first embodiment.

The overhang 160 extends from a rear end of the peripheral edge of the base 156. As illustrated in FIG. 17, the overhang 160 is disposed in a rear portion of the casing 4. In the up-down direction, the overhang 160 extends from the upper casing 10 up to the mating face 11 of the upper casing 10 and the lower casing 12. From the front toward the rear, the overhang 160 is inclined downward. When the first duct portions 136 are attached to the upper casing 10 as illustrated in FIG. 14, the overhangs 160 cover the openings 142 of the first duct portions 136. Thus, the first connection lines 132 are surrounded by the ducts 134. The first connection lines 132 are guided toward the rear of the casing 4 and also guided from the upper casing 10 to the lower casing 12 by the overhangs 160 and the first duct portions 136.

As illustrated in FIG. 15, each of the two second guides 150 is separated from the first guide 148 by the partition 152. The two second guides 150 are spaced in the left-right direction. A part of the base 156 is positioned between the two second guides 150. In the state where the second duct portions 138 are attached to the upper casing 10 as illustrated in FIG. 18, lower surfaces of the second guides 150 are inclined downward toward the front. Distal end portions of the second guides 150 extend toward the drainage outlets 46 of the lower casing 12. Thus, liquid (e.g., water) that entered the casing 4 through the cover attachment openings 16 (see FIG. 2) defined in the upper casing 10 flows forward by being guided by the second guides 150. The liquid flowing in the second guides 150 flows to the drainage outlets 46 from the distal end portions of the second guides 150 and is then discharged to the outside of the casing 4 through the drainage outlets 46.

As illustrated in FIG. 15, the second duct portion 138 includes a plurality of through holes 164. The plurality of through holes 164 is defined in the base 156 and the lateral 158. The through holes 164 penetrate the base 156 or the lateral 158. When the second duct portions 138 are attached to the upper casing 10, the through holes 164 receive projections 168, which will be described later.

As illustrated in FIG. 16, the charger 2 comprises a plurality of projections 168. The plurality of projections 168 extends downward from the upper inner surface of the upper casing 10. In the state where the second duct portions 138 are not attached to the upper casing 10, the projections 168 suppress the first connection lines 132 from exiting from regions to be surrounded by the second duct portions 138 and the upper casing 10. Thus, when the second duct portions 138 are attached to the upper casing 10, the first connection line 132 can be suppressed from being caught between the second duct portions 138 and the upper casing 10. Each of the plurality of projections 168 is received by corresponding one of the through holes 164 when the second duct portions 138 are attached to the upper casing 10.

Figure 19:
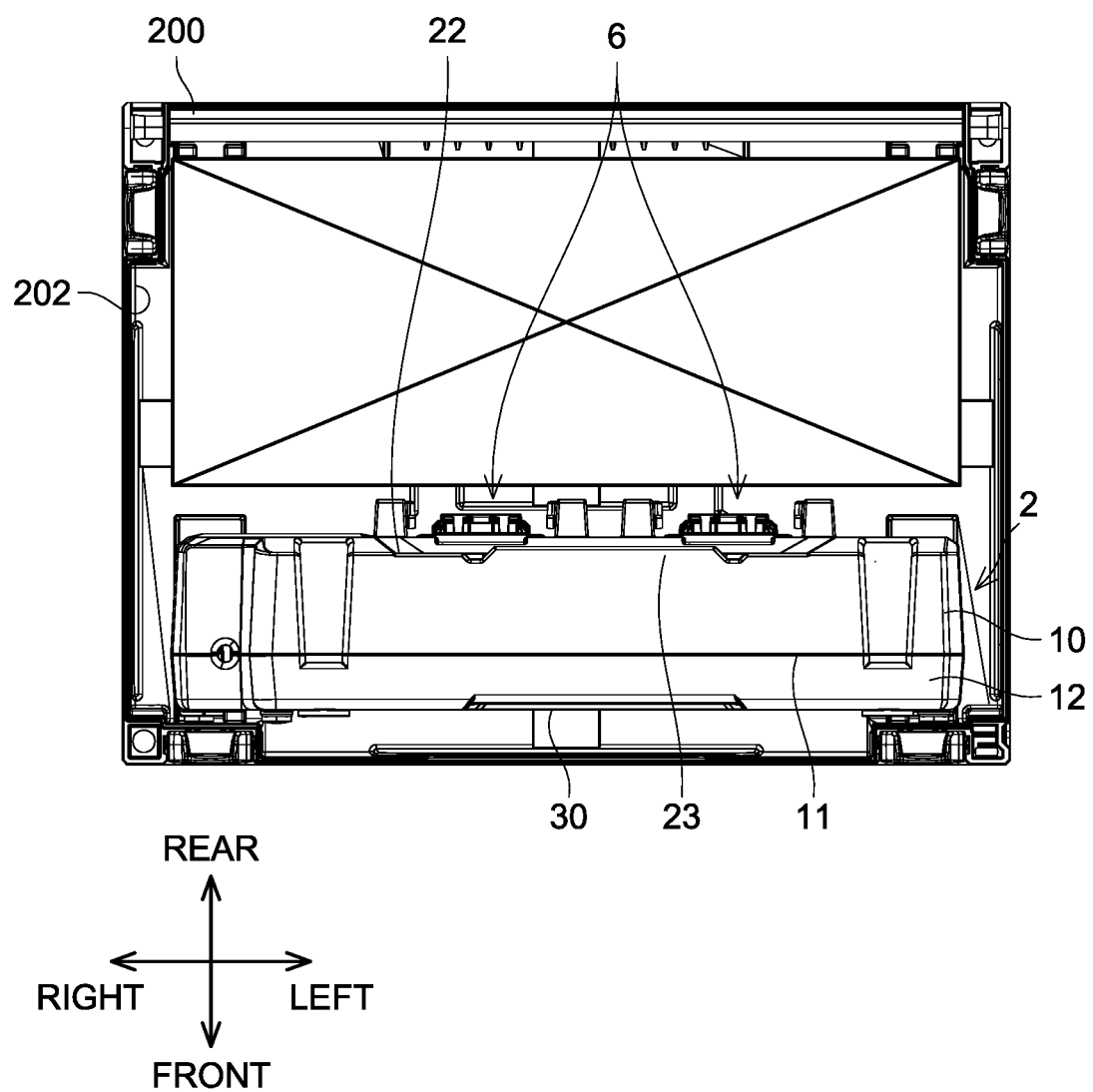
FIG. 19 is a top view of an accommodating box 200 with the charger 2 according to first embodiment accommodated therein.

The charger 2 can be placed in an accommodating box 200 illustrated in FIG. 19 to be carried around. In FIG. 19, when the accommodating box 200 is placed on a placement plane, a direction perpendicular to the placement plane is termed an up-down direction, a direction perpendicular to the up-down direction is termed a front-rear direction, and a direction perpendicular to the up-down direction and a left-right direction is termed a left-right direction. Hereinbelow, positional relationships of the accommodating box 200 and the charger 2 will be described using these directions. The accommodating box 200 includes an opening 202 that is open upward. Further, the accommodating box 200 comprises a lid (not illustrated) and the lid covers the opening 202 from above. Other than the charger 2, accessories of the charger 2 such as the battery packs BR etc., tools, etc. can be accommodated in the accommodating box 200. The accessories of the charger 2 and the tools are placed in a space of the accommodating box 200 where the charger 2 is not placed (in the space indicated by an open quadrangle with two oblique lines in FIG. 19). In this way, the charger 2 and the accessories can be carried around simultaneously.

In the state where the charger 2 is in the accommodating box 200, the charger 2 is raised and the recess 30 of the lower casing 12 faces an inner side surface of the accommodating box 200. Further, the recess 22 of the upper casing 10 and the recess 30 of the lower casing 12 are both positioned close to the lid of the accommodating box 200 (i.e., in an upper portion of the accommodating box 200). This helps the user to grab the recess 22 and the recess 30 with one of his/her hands to take the charger 2 out of the accommodating box 200 and put the charger 2 into the accommodating box 200. Further, the user can grab the charger 2 stably by hooking his/her fingers on the projection 23 and the projections 31.

The charger 2 according to the present embodiment comprises: the casing 4 including the cooling air inlets 26 and the cooling air outlets 44; the inner wall 90 extending from the inner surface of the casing 4 and defining the first accommodating space 100 between the inner surface of the casing 4 and the inner wall 90; and the centrifugal fan 96 including the fan air feed port 122 and disposed in the first accommodating space 100. The cooling air outlets 44 are disposed to face the fan air feed port 122. As illustrated in FIG. 10, the cooling air inlets 26 are disposed closer to the centrifugal fan 96 than the inner wall 90 is. In the direction of the rotation axis RX2 of the centrifugal fan 96, the width W1 between the inner wall 90 and the centrifugal fan 96 is less than or equal to 150% of the width W2 of the centrifugal fan 96. In this configuration, when the centrifugal fan 96 rotates, air is taken into the first accommodating space 100 through the cooling air inlets 26 and then flows to the centrifugal fan 96. Then, the air fed from the centrifugal fan 96 flows out from the casing 4 through the cooling air outlets 44. According to the configuration above, the width W1 between the inner wall 90 and the centrifugal fan 96 is less than or equal to 150% of the width W2 of the centrifugal fan 96 in the direction of the rotation axis RX2 of the centrifugal fan 96 (which is the left-right direction in the present embodiment), and thus the increase in the size of the charger 2 can be suppressed and resistance against the air flowing from the cooling air inlets 26 to the centrifugal fan 96 can be reduced. Further, since the cooling air outlets 44 of the casing 4 face the fan air feed port 122 of the centrifugal fan 96, resistance against the air flowing from the cooling air outlets 44 to the fan air feed port 122 can be reduced. Accordingly, resistance against the air flowing in the charger 2 can be reduced.

Further, as illustrated in FIG. 10, in the direction of the rotation axis RX2, the cooling air inlets 26 are disposed between the inner wall 90 and the centrifugal fan 96. If the cooling air inlets 26 are not disposed between the inner wall 90 and the centrifugal fan 96 in the direction of the rotation axis RX2, for example, if the cooling air inlets 26 are disposed immediately above the centrifugal fan 96, air taken into the first accommodating space 100 through the cooling air inlets 26 flows toward the inner wall 90 and then makes a turn to flow toward the centrifugal fan 96. According to the configuration above, the air taken into the first accommodating space 100 through the cooling air inlets 26 reaches the centrifugal fan 96 without making a turn. Thus, resistance against the air flowing from the cooling air inlets 26 to the centrifugal fan 96 can be further reduced. As a result, resistance against the air flowing in the charger 2 can be further reduced.

Further, when the charger 2 is placed on the placement plane, air is fed from the fan air feed port 122 of the centrifugal fan 96 in the down direction perpendicular to the placement plane. As illustrated in FIG. 11, the cooling air outlets 44 are disposed below the fan air feed port 122. Liquid such as water may enter the first accommodating space 100 through the cooling air inlets 26 of the casing 4. According to the configuration above, even when liquid enters the first accommodating space 100, it can be discharged to the outside of the casing 4 through the cooling air outlets 44.

Further, in the direction of the rotation axis RX2, the width W1 between the inner wall 90 and the centrifugal fan 96 is less than or equal to 50% of the diameter D1 of the blade unit 116 of the centrifugal fan 96. According to this configuration, the increase in the size of the charger 2 can be suppressed and air can be taken into the centrifugal fan 96 more efficiently.

Moreover, the charger 2 further comprises the second ribs 94 extending from the inner surface of the casing 4 such that they are disposed adjacent to the cooling air outlets 44. As illustrated in FIG. 11, the centrifugal fan 96 is supported by the second ribs 94 such that the centrifugal fan 96 is spaced from the inner surface of the casing 4. If the centrifugal fan 96 is in contact with the inner surface of the casing 4, vibration of the centrifugal fan 96, which is caused by the rotation of the centrifugal fan 96, is transmitted to the casing 4, which may result in noise. According to the configuration above, the centrifugal fan 96 is spaced from the inner surface of the casing 4 by being supported by the second ribs 94, and thus the noise caused by the rotation of the centrifugal fan 96 can be suppressed.

Further, as illustrated in FIG. 13, the second ribs 94 are disposed at the peripheral portion of the fan air feed port 122 of the centrifugal fan 96. If the second ribs 94 are disposed to block the fan air feed port 122 of the centrifugal fan 96, wind noise of the centrifugal fan 96 caused by the rotation of the centrifugal fan 96 may thereby be increased. In the configuration above, the second ribs 94 do not block the fan air feed port 122 of the centrifugal fan 96. Accordingly, the wind noise of the centrifugal fan 96 caused by the rotation of the centrifugal fan 96 can be suppressed, and thus the increase in noise can be suppressed.

Further, as illustrated in FIG. 3, the recesses 32 are defined in the outer surface of the casing 4. The cooling air outlets 44 are disposed in the recesses 32. If the cooling air outlets 44 are blocked by the placement plane on which the charger 2 is placed, an amount of air flowing into the first accommodating space 100 by the rotation of the centrifugal fan 96 decreases. This may cause a decrease in the cooling efficiency for the battery packs BP being on charge by the charger 2. In the configuration above, the cooling air outlets 44 are not blocked even when the charger 2 is placed on the placement plane. Thus, a decrease in the amount of air flowing into the first accommodating space 100 can be suppressed. As a result, the decrease in the cooling efficiency for the battery packs BP being on charge by the charger 2 can be suppressed.

Further, the charger 2 according to the present embodiment comprises the casing 4 including the air inlet port 50 and the air outlet port 66, and the first fan 86 that is disposed in the casing 4 and is configured to generate an air flow from the air inlet port 50 toward the air outlet port 66. The air inlet port 50 includes the plurality of first air inlets 52 defined in a side surface of the casing 4. The plurality of first air inlets 52 is open toward the inside of the casing 4 from a side portion of the side surface of the casing 4. The air outlet port 66 includes the plurality of air outlets 68, 70 defined in the casing 4. As illustrated in FIGS. 5 and 6, the inscribed circle 74 of each of the plurality of first air inlets 52 is smaller than the inscribed circle 76 of each of the plurality of air outlets 68, 70. In this configuration, the plurality of first air inlets 52 is defined in the side surface of the casing 4, and thus the area of a bottom surface of the casing 4 and the dimensions of the casing 4 in the left-right direction and the front-rear direction can be reduced as compared with a configuration in which air inlets are defined only in the bottom surface of the casing 4.

Further, as illustrated in FIG. 3, the air inlet port 50 includes the plurality of second air inlets 54 defined in the bottom surface of the casing 4. In this configuration, even when liquid enters the casing 4 through the plurality of first air inlets 52, the liquid can be discharged from the casing 4 through the plurality of second air inlets 54.

Further, as illustrated in FIG. 3, the plurality of first air inlets 52 is separate from the plurality of second air inlets 54. This configuration can reduce entry of foreign matters into the casing 4 through the air inlet port 50 as compared with a configuration in which the plurality of first air inlets 52 is connected with the plurality of second air inlets 54.

Further, as illustrated in FIG. 3, the casing 4 comprises the recess 34 recessed from the side surface and the recess 36 recessed from the bottom surface. The recess 34 is an example of first recess, and the recess 36 is an example of second recess. The plurality of first air inlets 52 is disposed in the recess 34. The plurality of second air inlets 54 is disposed in the recess 36. If the plurality of first air inlets 52 and the plurality of second air inlets 54 are blocked by surfaces such as walls, an amount of air taken into the casing 4 through the plurality of first air inlets 52 and the plurality of second air inlets 54 by the rotation of the first fan 86 decreases. The cooling efficiency for electric components in the casing 4 may thereby be decreased. In the configuration above, even when surfaces such as walls are in contact with the side surface and the bottom surface of the casing 4, the plurality of first air inlets 52 and the plurality of second air inlets 54 are not blocked. Thus, the decrease in the amount of air taken into the casing 4 through the plurality of first air inlets 52 and the plurality of second air inlets 54 can be suppressed. As a result, the decrease in the cooling efficiency for electric components, etc. in the casing 4 can be suppressed.

Moreover, the charger 2 further comprises the first rib 80 extending from the lower inner surface of the casing 4. The first rib 80 is disposed between the air inlet port 50 and the air outlet port 66 in the direction of air flow in the casing 4. As illustrated in FIG. 7, the distal end 80a of the first rib 80 is positioned above the plurality of first air inlets 52. In this configuration, the distal end 80a of the first rib 80 is positioned above the plurality of first air inlets 52, and thus even when a foreign matter enters the casing 4 through the plurality of first air inlets 52, the first rib 80 can suppress the foreign matter from going deeper into the casing 4.

Moreover, the charger 2 further comprises the circuit board 84 that is disposed in the casing 4 and has a longitudinal axis. As illustrated in FIGS. 8 and 9, the air inlet port 50 is disposed on a first direction side (right side in the present embodiment) of the circuit board 84 along the longitudinal axis. The air outlet port 66 is disposed on a second direction side (left side in the present embodiment) of the circuit board 84, which is opposite to the first direction side. In this configuration, the air taken into the casing 4 through the air inlet port 50 flows toward the longitudinal axis of the circuit board 84. The circuit board 84 can thereby be efficiently cooled.

Further, in the present embodiment, the charger 2, which is a battery-related device, comprises the upper casing 10 in which the connecting terminals of the battery attachment parts 6, which are electric components, are disposed; the lower casing 12 in which the circuit board 84 is disposed, wherein the lower casing 12 is configured to be combined with the upper casing 10; the first connection lines 132 connecting the connecting terminals to the circuit board 84; and the ducts 134 that surround the first connection lines 132 between the upper casing 10 and the ducts 134 and guide the first connection lines 132 from the upper casing 10 to the lower casing 12. As illustrated in FIG. 17, the ducts 134 extend from the upper casing 10 to the lower casing 12. In this configuration, the first connection lines 132 are connected to the connecting terminals and are disposed between the upper casing 10 and the ducts 134. Thereafter, the first connection lines 132 are connected to the circuit board 84 and the upper casing 10 is combined with the lower casing 12. In the configuration above, positioning of the first connection lines 132 can be done by the simple process of disposing the first connection lines 132 between the upper casing 10 and the ducts 134. This facilitates combining the upper casing 10 with the lower casing 12. Further, once the upper casing 10 and the lower casing 12 are combined together, damage to the first connection lines 132 due to the first connection lines 132 touching corners of the connecting terminals of the battery attachment parts 6 can be suppressed.

Further, as illustrated in FIG. 15, the ducts 134 each comprise the first duct portion 136 that is integrally formed with the upper casing 10 and includes the opening 142, wherein the opening 142 allows insertion and removal of the first connection line 132; and the second duct portion 138 that is detachably attached to the upper casing 10 and has the shape covering the opening 142 of the first duct portion 136. In this configuration, the first connection lines 132 already connected to the connecting terminals are disposed in the first duct portions 136 by being inserted into the openings 142 of the first duct portions 136, and the second duct portions 138 are attached to the upper casing 10. The openings 142 are thereby covered by the second duct portions 138. As a result, the first connection lines 132 are surrounded by the first duct portions 136, the second duct portions 138, and the upper casing 10. Thus, the first connection lines 132 being caught between the upper casing 10 and the lower casing 12 can be suppressed in combining the upper casing 10 with the lower casing 12, facilitating combining the upper casing 10 with the lower casing 12. Further, once the upper casing 10 and the lower casing 12 are combined together, damage to the first connection lines 132 due to the first connection lines 132 touching corners of the connecting terminals of the battery attachment parts 6 can be suppressed.

Moreover, the upper casing 10 further comprises the projections 168 extending from the inner surface. As illustrated in FIG. 14, the second duct portions 138 include the through holes 164 that receive the projections 168 when the second duct portions 138 are attached to the upper casing 10. If the first connection lines 132 are caught between the second duct portions 138 and the upper casing 10 in attaching the second duct portions 138 to the upper casing 10, the first connection lines 132 may be damaged. In the configuration above, the second duct portions 138 include the through holes 164 that receive the projections 168, and thus whether the first connection lines 132 are caught between the second duct portions 138 and the upper casing 10 or not can be visually observed via the through holes 164. Specifically, where the first connection lines 132 are caught between the second duct portions 138 and the upper casing 10, the first connection lines 132 are hung over the projections 168 and thus extends out through the through holes 164. As a result, the first connection lines 132 being caught between the second duct portions 138 and the upper casing 10 can be visually observed via the through holes 164. Thus, when the first connection lines 132 are caught between the second duct portions 138 and the upper casing 10, the second duct portions 138 can be detached from the upper casing 10 to adjust the position of the first connection lines 132 and be attached again to the upper casing 10, thereby suppressing the upper casing 10 and the lower casing 12 from being combined together with the first connection lines 132 caught.

Further, as illustrated in FIG. 15, the second duct portions 138 each comprise the first guide 148 guiding the connection line 132 and the second guides 150 that are separate from the first guide 148 and guide liquid having entered between the upper casing 10 and the lower casing 12. Liquid such as water may enter a space between the upper casing 10 and the lower casing 12. In the configuration above, adhesion of the liquid flowing in the second guides 150 to the first connection lines 132 guided by the first guides 148 can be suppressed. Thus, the liquid is suppressed from reaching the electric components and/or the circuit board 84 by flowing down the first connection lines 132.

Further, as illustrated in FIGS. 2 and 3, the upper casing 10 comprises the recess 22 recessed from the upper outer surface of the upper casing 10 that corresponds to the upper surface of the charger 2. The recess 22 is an example of upper recess. The lower casing 12 comprises the recess 30 recessed from the lower outer surface of the lower casing 12 that corresponds to the bottom surface of the charger 2. The recess 30 is an example of lower recess. With this configuration, the user can easily carry the charger 2 by grabbing the recess 22 and the recess 30 with his/her hand.

Moreover, the upper casing 10 further comprises the projection 23 disposed in the recess 22. The lower casing 12 further comprises the projections 31 disposed in the recess 30. With this configuration, the user can carry the charger 2 stably by hooking fingers of his/her hand on the projection 23 and the projections 31 upon grabbing the recess 22 and the recess 30 with the hand.

Second Embodiment

Figure 20:
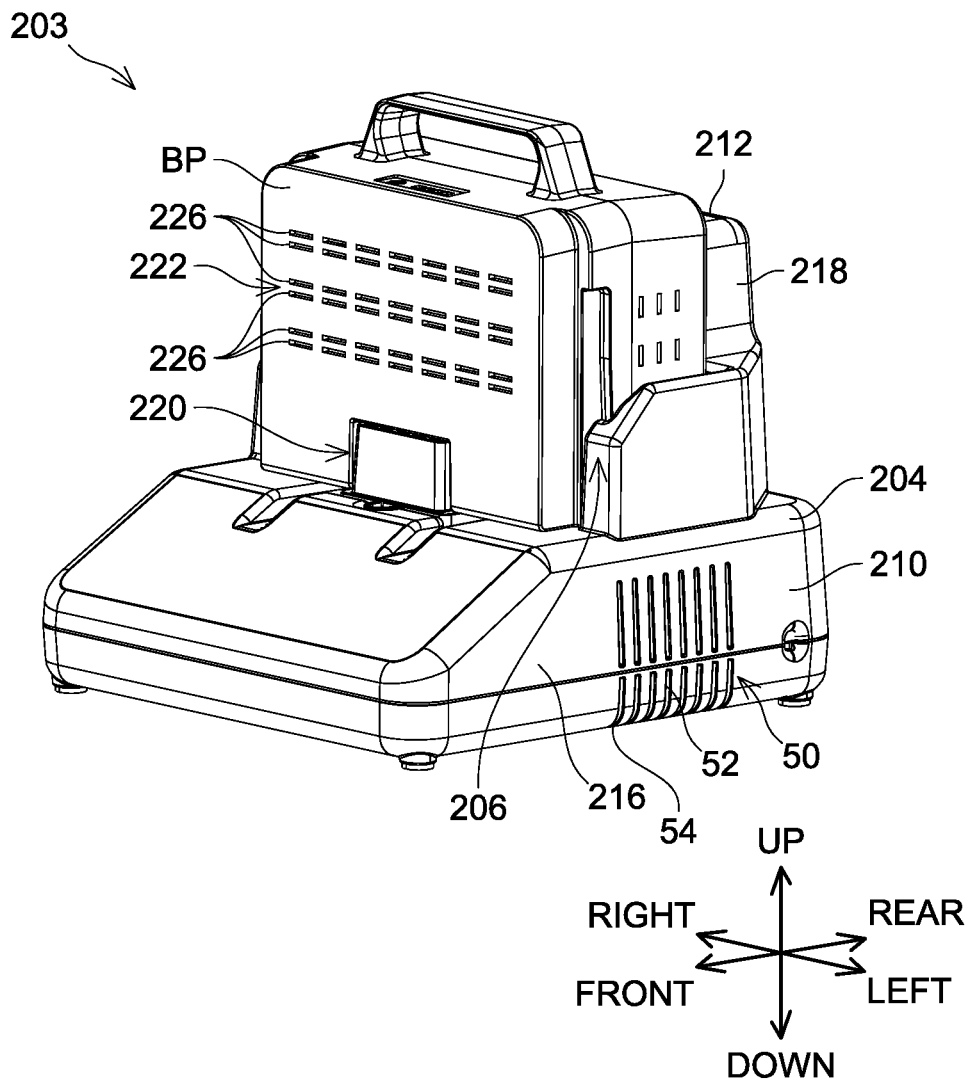
FIG. 20 is a perspective view of a charger 2 according to a second embodiment with a battery pack BP attached thereto.
Figure 21:
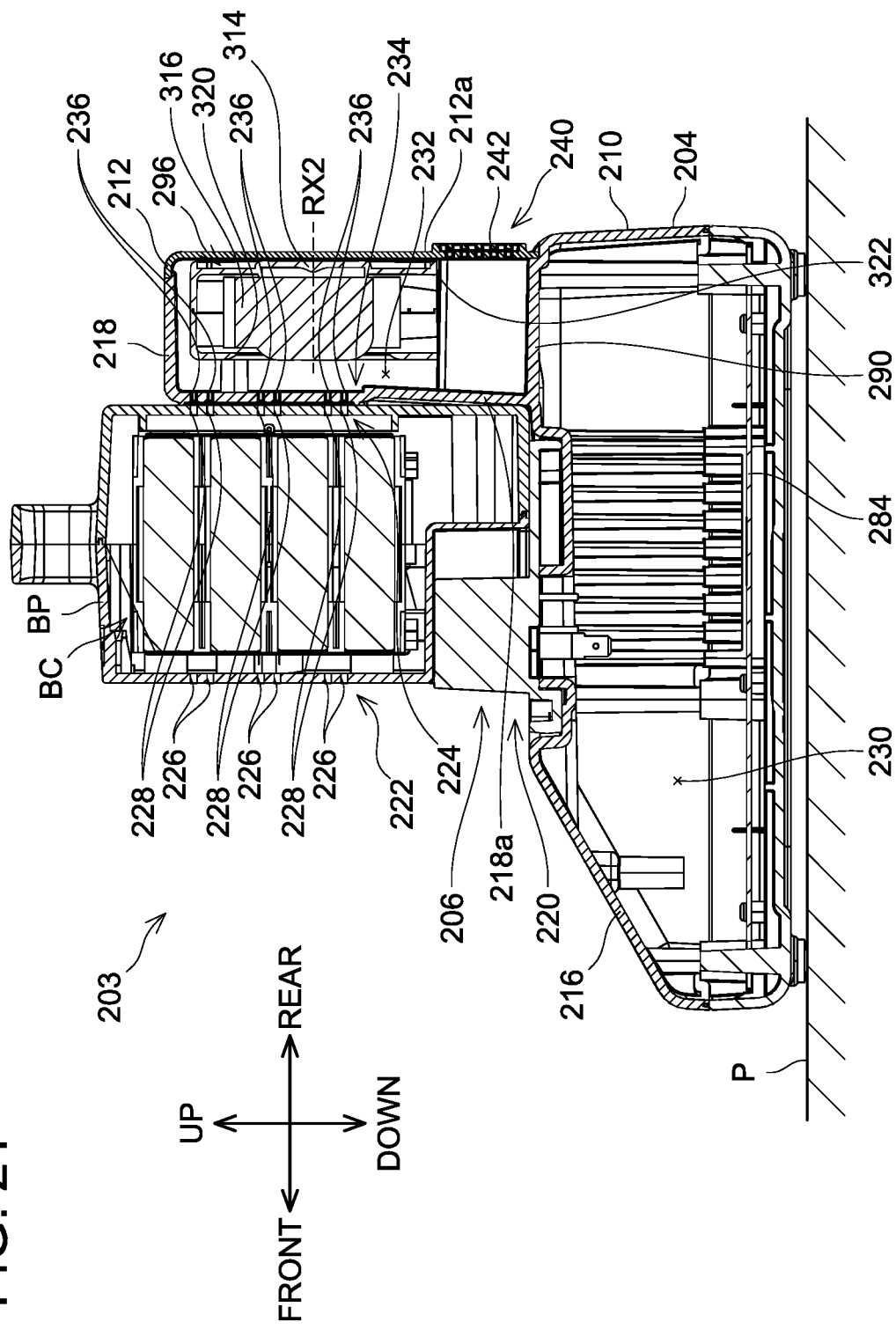
FIG. 21 is a cross-sectional view of the charger 2 according to the second embodiment with the battery pack BP attached thereto.
Figure 22:
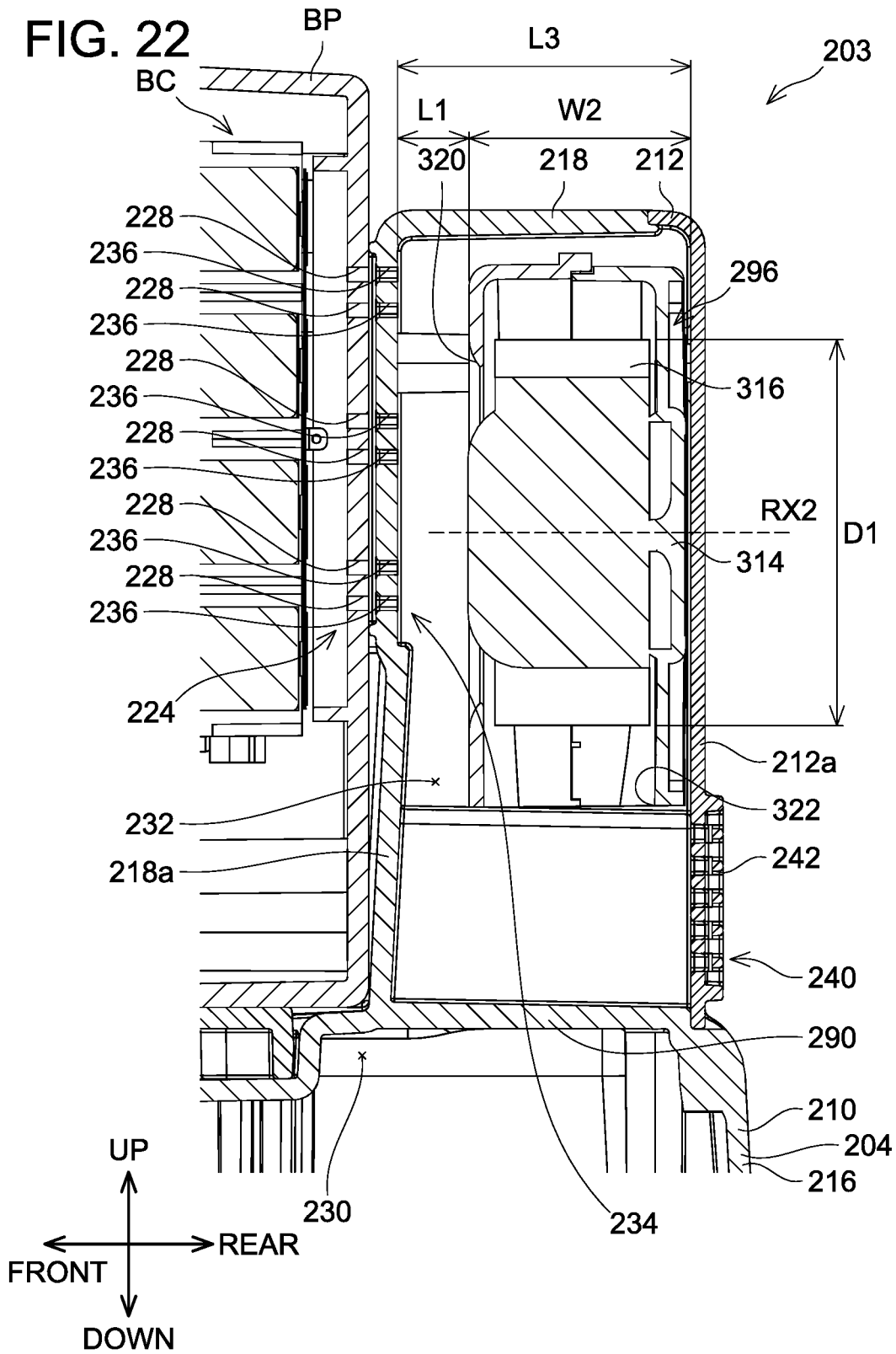
FIG. 22 is an enlarged view of the vicinity of an accommodating space 232 in FIG. 21.

Referring to FIGS. 20 to 22, a second embodiment will be described. As illustrated in FIG. 20, a charger 203 is a battery-related device for charging a battery pack BP. Hereinafter, when the charger 203 is placed on a placement plane P, a direction perpendicular to the placement plane P will be termed an up-down direction, a direction perpendicular to the up-down direction will be termed a left-right direction, and a direction perpendicular to the up-down direction and the left-right direction will be termed a front-rear direction. The up-down direction is parallel to the gravity direction.

As illustrated in FIG. 21, the charger 203 comprises a casing 204 and a battery attachment part 206. The casing 204 comprises a body casing 210 and a cover member 212. The body casing 210 comprises a lower portion 216 and an upper portion 218. When the charger 203 is placed on the placement plane P, a lower wall of the lower portion 216 faces the placement plane P.

As illustrated in FIG. 20, the battery attachment part 206 is integrally formed with the body casing 210. The battery attachment part 206 is disposed above the lower portion 216 and forward of the upper portion 218. The battery pack BP is detachably attached to the battery attachment part 206. In the state where the battery pack BP is attached to the battery attachment part 206, the battery attachment part 206 sandwiches the battery pack BP in the left-right direction.

As illustrated in FIG. 21, a battery connection 220 is attached to an upper wall of the lower portion 216. When the battery pack BP is attached to the battery attachment part 206, the battery connection 220 is electrically connected to a terminal (not illustrated) of the battery pack BP.

The battery pack BP includes a battery air inlet port 222 and a battery air outlet port 224. The battery air inlet port 222 includes a plurality of battery air inlets 226. The battery air inlets 226 penetrate a front wall of the battery pack BI in the front-rear direction. The battery air outlet port 224 includes a plurality of battery air outlets 228. The battery air outlets 228 penetrate a rear wall of the battery pack BP in the front-rear direction. A space inside of the battery pack BP communicates with a space outside of the battery pack BP via the battery air inlet port 222 and the battery air outlet port 224. The battery pack BP includes a plurality of battery cells BC therein.

The upper portion 218 extends upward from a rear portion of the upper wall of the lower portion 216. The upper portion 218 is disposed rearward of the battery attachment part 206. In the left side view (or right side view) of the charger 203, the upper portion 218 has a shape elongated in the up-down direction. In the state where the battery pack BP is attached to the battery attachment part 206, a front wall 218a of the upper portion 218 faces the rear wall of the battery pack BP.

The upper portion 218 includes an air intake port 234. The air intake port 234 includes a plurality of air inlets 236. The air inlets 236 penetrate the front wall 218a of the upper portion 218 in the front-rear direction. The air inlets 236 are defined in an upper part of the upper portion 218. The air inlets 236 are arranged in the up-down direction. In the state where the battery pack BP is attached to the battery attachment part 206, the air inlets 236 face the battery air outlets 228.

The cover member 212 is detachably attached to a rear end of the upper portion 218. The cover member 212 faces the front wall 218a of the upper portion 218. The cover member 212 includes an air outlet port 240. The air outlet port 240 includes a plurality of air outlets 242. The air outlets 242 penetrate a rear wall 212a of the cover member 212. The air outlets 242 are defined in a lower part of the cover member 212. In the state where the cover member 212 is attached to the upper portion 218, the air outlets 242 are offset downward with respect to the air inlets 236. That is, as the charger 203 is viewed in the front-rear direction, the air outlets 242 do not overlap the air inlets 236.

The charger 203 further comprises an inner wall 290. The inner wall 290 is integrally formed with the lower portion 216 and the upper portion 218. In the up-down direction, the inner wall 290 is at substantially the same position as the upper wall of the lower portion 216. The inner wall 290 partitions an internal space of the casing 204 into a board space 230 and an accommodating space 232. The board space 230 is defined by the lower portion 216 and the inner wall 290. The accommodating space 232 is defined by the upper portion 218, the cover member 212, and the inner wall 290. The accommodating space 232 communicates with a space outside of the charger 203 via the plurality of air inlets 236 and the plurality of air outlets 242.

When the charger 203 is on the placement plane P, the accommodating space 232 is positioned above the board space 230 with the inner wall 290 interposed therebetween. Further, when the charger 203 is on the placement plane P, the board space 230 is positioned below the battery pack BP and the accommodating space 232 is positioned rearward of the battery pack BP.

The charger 203 further comprises a circuit board 284 and a fan 296. The circuit board 284 is disposed in the board space 230. The circuit board 284 is fixed to the lower wall of the lower portion 216. The circuit board 284 is disposed along a plane perpendicular to the up-down direction. The circuit board 284 is supplied with electric power from an external and controls charging of the battery pack BP.

The fan 296 is, for example, a centrifugal fan, and the centrifugal fan is, for example, a squirrel cage fan. The fan 296 is disposed in the accommodating space 232. The fan 296 is disposed above the inner wall 290. The fan 296 faces the air inlets 236 in the front-rear direction. Further, the fan 296 is disposed above the air outlets 242 in the up-down direction. A rotation axis RX2 of the fan 296 extends in the front-rear direction. The rotation axis RX2 is substantially parallel to the front-rear direction.

As illustrated in FIG. 22, the fan 296 comprises a fan casing 314 and a blade unit 316. The fan casing 314 comprises a fan air inlet 320 and a fan air feed port 322. The fan air inlet 320 penetrates a front wall of the fan casing 314 in the front-rear direction. The fan air inlet 320 faces the front wall 218*a* of the upper portion 218 in the front-rear direction. Further, the fan air inlet 320 faces the air inlets 236 in the front-rear direction. The fan air feed port 322 penetrates a lower wall of the fan casing 314 in the up-down direction. The fan air feed port 322 faces the inner wall 290.

A distance L1 between the front wall 218*a* of the upper portion 218 and the fan air inlet 320 is equal to or less than 50% of a width W2 of the fan casing 314 in the front-rear direction, and in the present embodiment, the distance L1, is 30% of the width W2. Further, a distance L3 between the front wall 218*a* of the upper portion 218 and the rear wall 212*a* of the cover member 212 in the front-rear direction (i.e., a distance between the air inlets 236 and the air outlets 242 in the front-rear direction) is equal to or less than 200% of the width W2, and in the present embodiment, the width W3 is 140% of the width W2.

The blade unit 316 is housed in the fan casing 314. The blade unit 316 is controlled by the circuit board 284 (see FIG. 21) and rotates about the rotation axis RX2. The blade unit 316 directs a rearward air flow (i.e., air flow in a direction along the rotation axis RX) downward (i.e., in a direction perpendicular to the rotation axis RX). The distance L1 between the from wall 218*a* of the upper portion 218 and the fan air inlet 320 is equal to or less than 50% of a diameter D1 of the blade unit 316 (i.e., a width of the blade unit 316 in the up-down direction), and in the present embodiment, the distance L1 is 15% of the diameter D1. The distance L1 may be equal to or less than 25% of the diameter D1 of the blade unit 316. This configuration reduces resistance against air flowing from the air inlets 236 to the fan air inlet 320 as compared with a configuration in which the distance L1 is greater than 25% and equal to or less than 50% of the diameter D1 of the blade unit 316.

Next, how air flows when the fan 296 operates will be described. When the fan 296 rotates about the rotation axis RX2, a negative pressure is generated in a space between the front wall 218*a* of the upper portion 218 and the fan air inlet 320. First, air flows into the space inside of the battery pack BP through the battery air inlets 226 (see FIG. 21) and flows around all the battery cells BC. All of the battery cells BC are thereby cooled. Then, the air flows out to the space outside of the battery pack 13P through the battery air outlets 228. This air flows into the accommodating space 232 through the air inlets 236. Further, the air flows into the fan casing 314 through the fan air inlet 320. Then, the air is fed out downward by the blade unit 316 and flows out to the outside of the fan casing 314 (i.e., the accommodating space 232) through the fan air feed port 322. This air changes its flow direction from downward to rearward, so that it flows out to the outside of the charger 203 through the air outlets 242.

Effects

The charger 203 according to the present embodiment is used to charge the battery pack BP. The charger 203 comprises: the casing 204 defining the accommodating space 232 and the board space 230 therein and including the air inlets 236 and the air outlets 242; the fan 296 disposed in the accommodating space 232 and including the fan air inlet 320; and the circuit board 284 disposed in the board space 230 and configured to control charging of the battery pack BP. The accommodating space 232 communicates with the space outside of the charger 203 via the air inlets 236 and the air outlets 242. When the fan 296 rotates about the rotation axis RX2, air flows into the accommodating space 232 through the air inlets 236 and flows toward the air outlets 242, so that the battery pack BP on charge is cooled. In the state where the charger 203 is on the placement plane P, the accommodating space 232 is positioned above the board space 230 in the up-down direction parallel to the gravity direction.

For example, in a configuration in which air flows through both of the accommodating space 232 and the board space 230 when the fan 296 rotates, water and/or dust contained in the air enters the board space 230. If the water and/or dust contact(s) the circuit board 284, the circuit board 284 may malfunction. Since the air flows through the accommodating space 232 in the configuration above, the entry of water and/or dust contained in the air into the board space 230 can be suppressed. Thus, the malfunction of the circuit board 284 can be suppressed and the increase in the size of the charger 203 in a direction perpendicular to the up-down direction can be suppressed.

Further, the casing 204 comprises the front wall 218*a* of the upper portion 218 that faces the fan air inlet 320 in the direction along the rotation axis RX2 and the rear wall 212*a* of the cover member 212 that faces the front wall 218*a* of the upper portion 218 in the direction along the rotation axis RX2. The air inlets 236 are defined in the front wall 218*a* of the upper portion 218. The air outlets 242 are defined in the rear wall 212*a* of the cover member 212.

If die air inlets 236 are not defined in the front wall 218*a* of the upper portion 218, air that flowed into the accommodating space 232 through the air inlets 236 changes its flow direction significantly to flow to the fan air inlet 320. Further, if the air outlets 242 are not defined in the rear wall 212*a* of the cover member 212, air fed out from the fan 296 changes its flow direction significantly to flow to the air outlets 242. In the configuration above, the air inlets 236 are defined in the front wall 218a of the upper portion 218 and the air outlets 242 are defined in the rear wall 212a of the cover member 212, and thus the air flowed into the accommodating space 232 through the air inlets 236 can flow to the fan air inlet 320 without changing its flow direction significantly, and the air fed out from the fan 296 can also flow to the air outlets 242 without changing its flow direction significantly. Thus, resistance against the air flowing through the accommodating space 232 can be reduced.

Further, in the direction along the rotation axis RX2, the distance L1 between the front wall 218a of the upper portion 218 and the fan air inlet 320 is less than or equal to 50% of the diameter 1 of the blade unit 316 of the fan 296.

In the configuration above, the increase in the size of the charger 203 can be suppressed and the resistance against the air flowing from the air inlets 236 to the fan air inlet 320 can be reduced.

Further, in the direction along the rotation axis RX2, the distance L1 between the front wall 218a of the upper portion 218 and the fan air inlet 320 is less than or equal to 25% of the diameter D1 of the blade unit 316 of the fan 296.

In the configuration above, the increase in the size of the charger 203 can be suppressed and the resistance against the air flowing from the air inlets 236 to the fan air inlet 320 can be further reduced.

Further, in the direction along the rotation axis RX2, the distance L3 between the front wall 218a of the upper portion 218 and the rear wall 212a of the cover member 212 is less than or equal to 200% of the width W2 of the fan 296.

In the configuration above, the increase in the size of the charger 203 can be suppressed.

Further, in the direction along the rotation axis RX2, the distance L1 between the front wall 218a of the upper portion 218 and the fan air inlet 320 is less than or equal to 150% of the width W2 of the fan 296.

In the configuration above, the increase in the size of the charger 203 can be suppressed and the resistance against the air flowing from the air inlets 236 to the fan air inlet 320 can be reduced.

Further, the battery pack BP includes the battery air outlets 228 communicating the space inside of the battery pack BP with the space outside of the battery pack BP. When the fan 296 rotates, air inside of the battery pack BP flows into the accommodating space 232 through the battery air outlets 228 and the air inlets 236 and flows toward the air outlets 242, so that the battery pack BP on charge is cooled.

In a configuration in which air fed out by the fan 296 cools the battery pack BP, the air fed out by the fan 296 enters the battery pack BP and may flow around only a part of the battery cells BC in the battery pack BP. This may lead to failing to cool the battery pack BP uniformly. In the configuration above, the air inside of the battery pack BP flows into the accommodating space 232 through the battery air outlets 228 and the air inlets 236 due to the negative pressure generated by the rotation of the fan 296. Thus, the air inside of the battery pack BP flows around all of the battery cells BC in the battery pack BP. As a result, the battery pack BP can be cooled uniformly.

When the battery pack BP is attached to the charger 203, the air inlets 236 face the battery air outlets 228.

The configuration above facilitates the air inside of the battery pack BP to flow into the accommodating space 232 through the battery air outlets 228 and the air inlets 236.

Moreover, the charger 203 further comprises the battery attachment part 206 to which the battery pack BP is attached.

When the charger 203 is placed on the placement plane P, the board space 230 is positioned below the battery attachment part 206, and the accommodating space 232 is positioned in a direction perpendicular to the up-down direction with respect to the battery attachment part 206.

In the configuration above, a space positioned above the board space 230 except for the accommodating space 232 can be efficiently used.

Further, the fan 296 functions as a centrifugal fan.

A static pressure generated by the rotation of a centrifugal fan is higher than a static pressure generated by the rotation of an axial fan. The configuration above can flow air in the battery pack 31 even when resistance against the air in the battery pack BP is high.

Further, as the charger 203 is viewed in the direction along the rotation axis RX2, the air inlets 236 do not overlap the air outlets 242.

In a case the fan 296 functions as a centrifugal fan, air is fed out from the fan 296 in a direction perpendicular to the rotation axis RX2. In a configuration in which the air inlets 236 overlap the air outlets 242 as the charger 203 is viewed in the direction along the rotation axis RX2, the air fed out from the fan 296 changes its flow direction several times before reaching the air outlets 242. Resistance against the air flowing from the fan 296 to the air outlets 242 is thereby increased. In the configuration above, the air fed out from the fan 296 changes its flow direction less frequently as compared with the configuration in which the air inlets 236 overlap the air outlets 242 as the charger 203 is viewed in the direction along the rotation axis RX2. Thus, the resistance against the air flowing from the fan 296 to the air outlets 242 can be reduced.

Further, the casing 204 comprises the body casing 210 including the air inlets 236 and the cover member 212 including the air outlets 242 and configured to be detachably attached to the body casing 210. The accommodating space 232 is defined between the body casing 210 and the cover member 212.

The configuration above facilitates maintenance of the accommodating space 232 since the cover member 212 can be detached from the body casing 210.

(Correspondence Relationships)

The front wall 218a of the upper portion 218 is an example of "first wall". The rear wall 212a of the cover member 212 is an example of "second wall".

Third Embodiment

Figure 24:
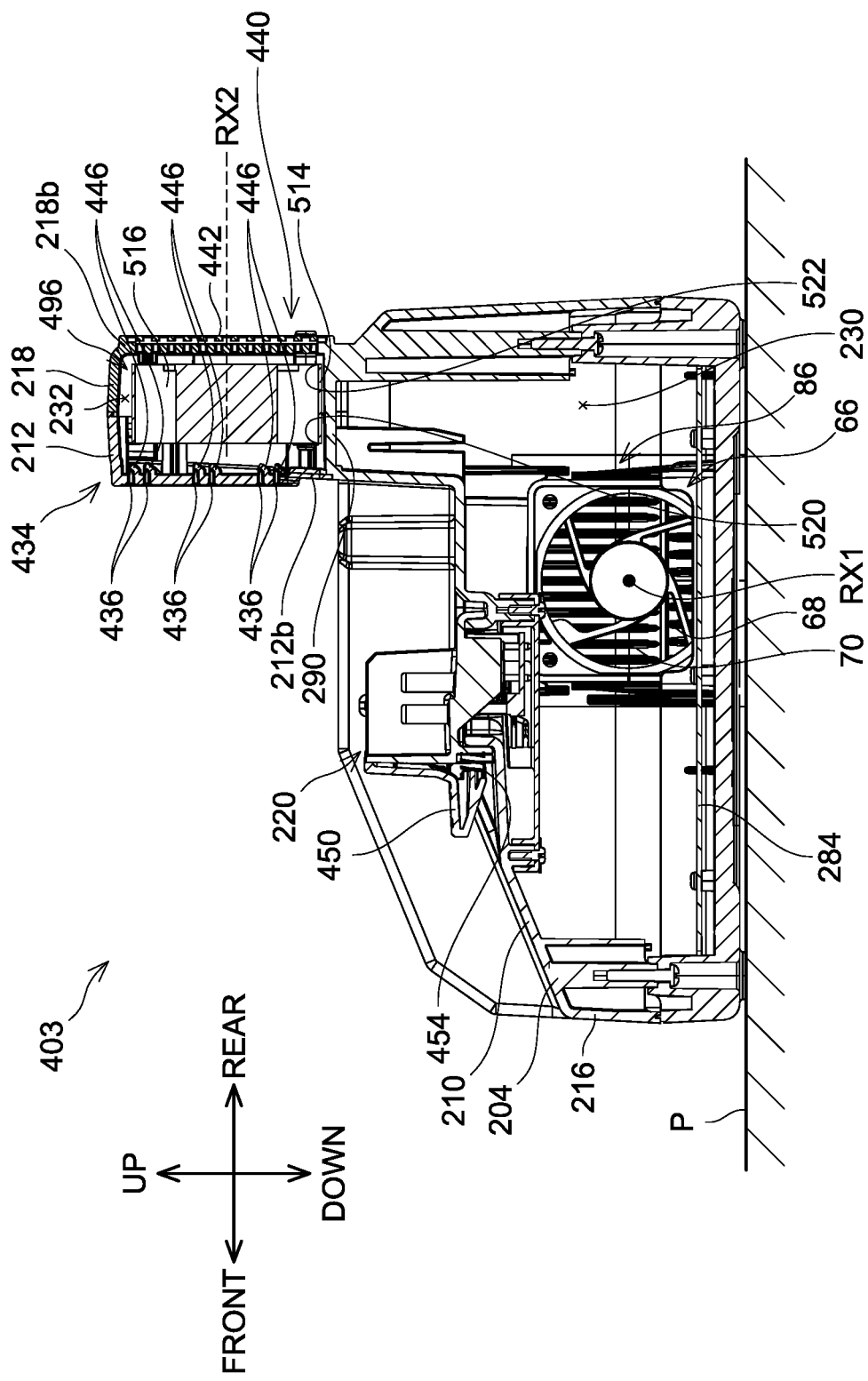
FIG. 24 is a cross-sectional view of the charger 2 according to the third embodiment.

Referring to FIGS. 23 to 26, a third embodiment will be described. For the third embodiment, only differences from the second embodiment will be described, and like elements will be labeled with like reference signs and description for them will be omitted. As illustrated in FIG. 23, in the third embodiment, a charger 403 further comprises a lever 450 in addition to a casing 204, a battery attachment part 206, and an inner wall 290 (see FIG. 24). The lever 450 is pivotably attached to a battery connection 220. The lever 450 comprises an engagement claw 452 near its upper end. The engagement claw 452 extends rearward. In the state where a battery pack BP is attached to the battery attachment part 206, the engagement claw 452 is engaged with the battery pack BP. This suppresses detachment of the battery pack BP from the battery attachment part 206. As illustrated in FIG. 24, a biasing member 454 is disposed between the vicinity of a lower end of the lever 450 and the battery connection 220. The biasing member 454 biases the lower end of the lever 450 such that the engagement claw 452 is biased toward the battery pack BP. When the lever 450 is pushed downward in the state where the battery pack BP is attached to the battery attachment part 206, the lever 450 pivots and the engagement claw 452 is thereby disengaged from the battery pack BP. Thus, the battery pack BP can be detached from the battery attachment part 206. When the user lets go of the pushed lever 450, the engagement claw 452 is moved toward the battery pack BP by the biasing force of the biasing member 454 and engages with the battery pack BP.

Figure 25:
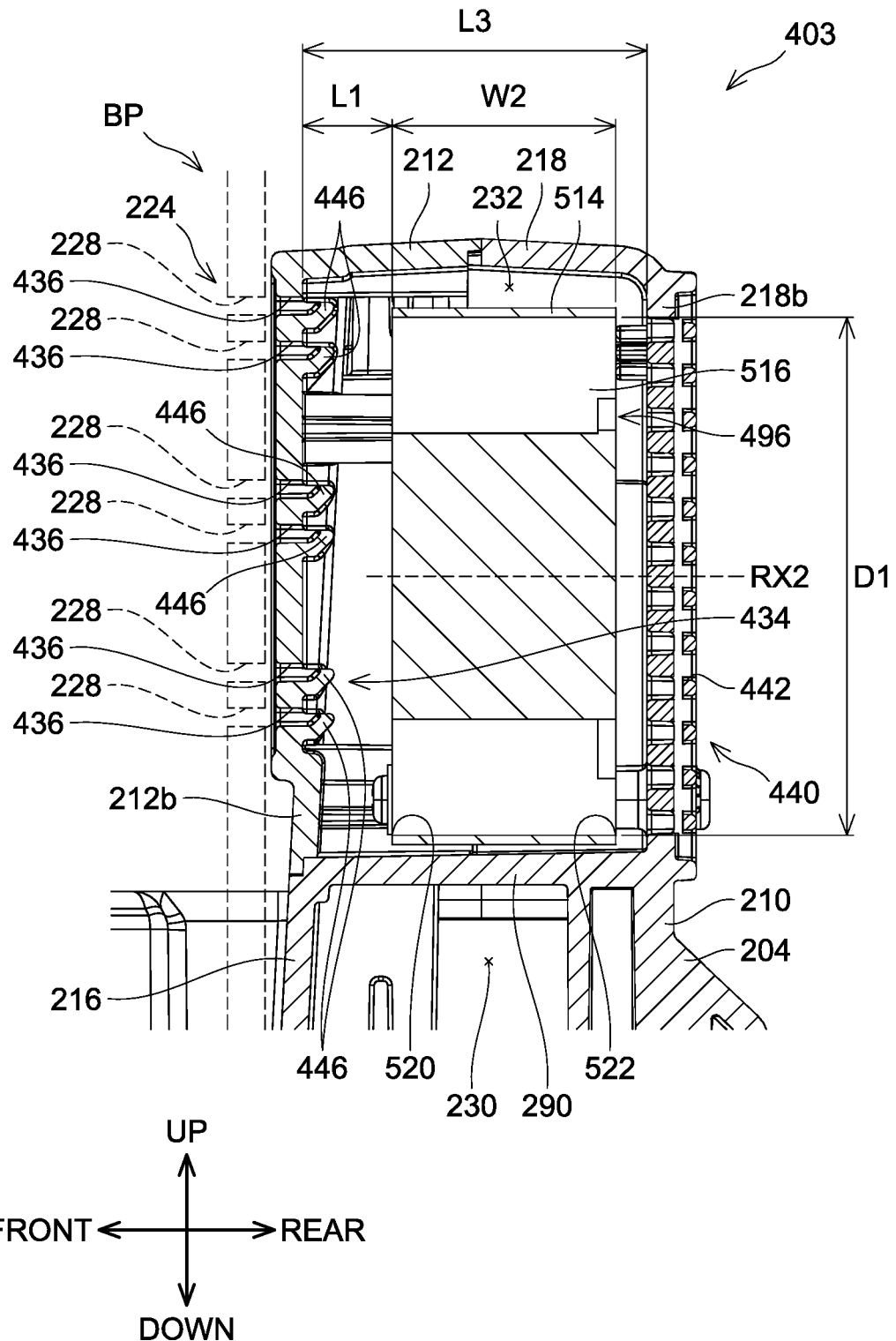
FIG. 25 is an enlarged view of the vicinity of an accommodating space 232 in FIG. 24.

As illustrated in FIG. 25, an upper portion 218 extends upward from a rear portion of an upper wall of a lower portion 216. The upper portion 218 includes an air outlet port 440. The air outlet port 440 includes a plurality of air outlets 442. The air outlets 442 penetrate a rear wall 218b of the upper portion 218. An accommodating space 232 communicates with a space outside of the charger 403 via the plurality of air outlets 442.

A cover member 212 is detachably attached to the upper portion 218 from the front. The cover member 212 is disposed forward of the upper portion 218 and above the lower portion 216. A front wall 212b of the cover member 212 faces the rear wall 218b of the upper portion 218. In the state where the battery pack BP is attached to the battery attachment part 206, the front wall 212b of the cover member 212 faces a rear wall of the battery pack BP. In FIG. 25, the battery pack BP is depicted with broken lines.

The cover member 212 includes an air inlet port 434. The air inlet port 434 includes a plurality of air inlets 436. The air inlets 436 penetrate the front wall 212b of the cover member 212 in the front-rear direction. The air inlets 436 are arranged in the up-down direction. The accommodating space 232 communicates with a space outside of the charger 403 via the air inlets 436. The air inlets 436 are disposed to face the air outlets 442. That is, as the charger 403 is viewed in the direction along the rotation axis RX2, at least a part of the air inlets 436 overlaps the air outlets 242. Further, in the state where the battery pack BP is attached to the battery attachment part 206, the air inlets 436 face battery air outlets 228.

Ribs 446 are disposed on the front wall 212b of the cover member 212. The ribs 446 are integrally formed with the front wall 212b of the cover member 212. The ribs 446 are connected to the front wall 212b of the cover member 212 near lower ends of the air inlets 236. The ribs 446 extend rearward and upward from the front wall 212b of the cover member 212. The ribs 446 suppress the accommodating space 232 from being seen through the air inlets 436 as the charger 403 is viewed from the front.

The inner wall 290 extends forward from near a connection of the lower portion 216 with the upper portion 218 and is connected to the lower portion 216. The inner wall 290 partitions a space inside of the casing 204 into a board space 230 and the accommodating space 232.

As illustrated in FIG. 24, a first fan 86 is disposed in the board space 230. The first fan 86 is, for example, an axial fan. When the first fan 86 rotates about a rotation axis RX1, air flows into the board space 230 through the lower air inlet port 50 (see FIG. 23) of the lower portion 216. This air flows above a circuit board 284 to the first fan 86. The circuit board 284 is thereby cooled. Then, the air is fed out by the first fan 86 and flows out to the space outside of the charger 403 through a lower air outlet port 66 of the lower portion 216.

The charger 403 further comprises a fan 496. The fan 496 is, for example, an axial fan. The fan 496 is disposed in the accommodating space 232. The fan 496 is disposed above the inner wall 290. As the charger 403 is viewed in the direction along the rotation axis RX2, the fan 496 overlaps both at least a part of the air inlets 436 and at least a part of the air outlets 442.

As illustrated in FIG. 25, a fan casing 514 includes a fan air inlet 520 and a fan air feed port 522. The fan air inlet 520 penetrates a front wall of the fan casing 514 in the front-rear direction. In the front-rear direction, the fan air inlet 520 faces the front wall 212b of the cover member 212. Further, in the front-rear direction, the fan air inlet 520 faces the air inlets 436. As the charger 403 is viewed in the direction along the rotation axis RX2, the fan air inlet 520 overlaps at least a part of the air inlets 436. The fan air feed port 522 penetrates a rear wall of the fan casing 514 in the front-rear direction. In the front-rear direction, the fan air feed port 522 faces the rear wall 218b of the upper portion 218. Further, in the front-rear direction, the fan air feed port 522 faces the air outlets 442. As the charger 403 is viewed in the direction along the rotation axis RX2, the fan air feed port 522 overlaps at least a part of the air outlets 442.

A distance L1 between the front wall 212b of the cover member 212 and the fan air inlet 520 is less than or equal to 50% of a width W2 of the fan casing 514 in the front-rear direction, and in the present embodiment, the distance L1 is 30% of the width W2. Further, a distance L3 between the front wall 212b of the cover member 212 and the rear wall 218b of the upper portion 218 in the front-rear direction (i.e., a distance between the air inlets 436 and the air outlets 442 in the front-rear direction) is less than or equal to 200% of the width W2, and in the present embodiment, the distance L3 is 140% of the width W2.

A blade unit 516 is housed in the fan casing 514. The blade unit 516 is controlled by the circuit board 284 (see FIG. 24) and rotates about the rotation axis RX2. The blade unit 516 feeds air rearward (i.e., in the direction along the rotation axis RX2). The distance L1 between the front wall 212b of the cover member 212 and the fan air inlet 520 is less than or equal to 50% of a diameter D1 of the blade unit 516 (i.e., a width of the blade unit 516 in the up-down direction), and in the present embodiment, the distance L1 is 15% of the diameter D1. The distance L1 may be less than or equal to 25% of the diameter D1 of the blade unit 516. This configuration reduces resistance against air flowing from the air inlets 436 to the fan air inlet 520 as compared with a configuration in which the distance L1 is greater than 25% and less than or equal to 50% of the diameter D1 of the blade unit 516.

Figure 26:
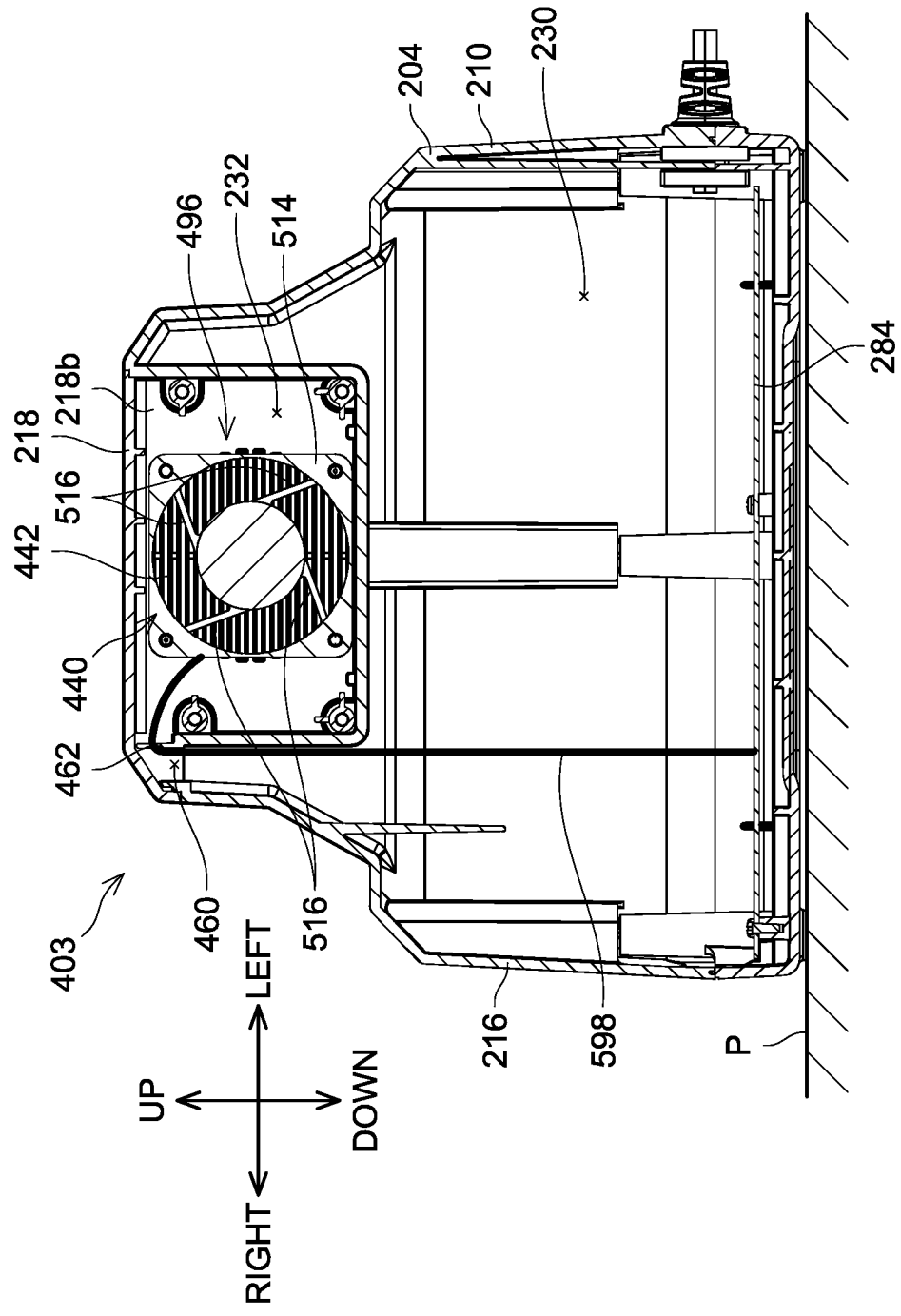
FIG. 26 is a cross-sectional view of the charger 2 according to the third embodiment.

As illustrated in FIG. 26, the upper portion 218 includes a communication passage 460 therein. The communication passage 460 is disposed rightward of the accommodating space 232 and above the board space 230. The communication passage 460 extends in the up-down direction. The communication passage 460 communicates with the board space 230 and the accommodating space 232. Further, the upper portion 218 includes a holder groove 462. The holder groove 462 is disposed adjacent to and leftward of the communication passage 460.

The fan 496 is electrically connected to the circuit board 284 via a fan connection line 598. The fan connection line 598 extends from the accommodating space 232 to the board space 230 through the communication passage 460. Further, the fan connection line 598 is held by the holder groove 462.

Next, how air flows when the fan 496 operates will be described. As illustrated in FIG. 25, when the fan 496 rotates about the rotation axis RX2, a negative pressure is generated between the front wall 212b of the cover member 212 and the fan air inlet 520. First, air flows into the battery pack BP through a battery air inlet (not illustrated) and flows around a battery cell (not illustrated). The battery cell is thereby cooled. Then, the air flows out to the space outside of the battery pack BP through the battery air outlets 228. This air flows into the accommodating space 232 through the air inlets 436. Further, the air flows into the fan casing 514 through the fan air inlet 520. Then, the air is fed out rearward by the blade unit 516 and flows out to the outside of the fan casing 514 (i.e., the accommodating space 232) through the fan air feed port 522. This air flows out to the outside of the charger 403 through the air outlets 442 without changing its flow direction.

(Effects)

In the present embodiment, the fan 496 functions as an axial fan.

In the configuration above, air flows through the accommodating space 232 due to the rotation of the axial fan, without changing its flow direction. Thus, resistance against the air flowing through the accommodating space 232 can be reduced.

Further, as the charger 403 is viewed in the direction along the rotation axis RX2, the air inlets 436 at least partially overlap the fan 496 and the air outlets 442.

In the case the fan 496 functions as an axial fan, air is fed out from the fan air feed port 522 in the direction along the rotation axis RX2. In the configuration above, the air inlets 436 at least partially overlap the fan 496 and the air outlets 442 as the charger 403 is viewed in the direction along the rotation axis RX2, and thus resistance against the air flowing from the fan 496 to the air outlets 442 can be reduced.

In one embodiment, the charger 2 may not comprise the second ribs 94. In this instance, the centrifugal fan 96 is in contact with the lower inner surface of the lower casing 12 and the fan air feed port 122 is disposed immediately above the cooling air outlets 44.

In one embodiment, the direction in which the fan air feed port 122 is open is not limited to the down direction. For example, the fan air feed port 122 may be open forward or in the left-right direction.

In one embodiment, the recess 32 may not be defined in the lower casing 12.

In one embodiment, the air inlet port 50 may not include the plurality of second air inlets 54 and may comprise only the plurality of first air inlets 52.

In one embodiment, the recess 34 and the recess 36 may not be defined in the lower casing 12.

In one embodiment, the plurality of first air inlets 52 may be inclined and open in the left-right direction.

In one embodiment, the first duct portions 136 may be configured to be detachably attached to the upper casing 10.

In one embodiment, the first guides 148 and the second guides 150 may be separate components.

The invention claimed is:

1. A charger comprising:
a casing including an air inlet and an air outlet;
an inner wall extending from an inner surface of the casing and defining an accommodating space between the inner surface of the casing and the inner wall; and
a centrifugal fan including an air feed port and disposed in the accommodating space,
wherein
the air outlet is disposed to face the air feed port,
the air inlet is disposed closer to the centrifugal fan than the inner wall is, and
in a direction of a rotation axis of the centrifugal fan, a width between the inner wall and the centrifugal fan is less than or equal to 150% of a width of the centrifugal fan.

2. The charger according to claim 1, wherein in the direction of the rotation axis, the air inlet is disposed between the inner wall and the centrifugal fan.

3. The charger according to claim 2, wherein
when the charger is placed on a placement plane, air is fed from the air feed port of the centrifugal fan in a down direction perpendicular to the placement plane,
the air outlet is disposed below the air feed port,
in the direction of the rotation axis, the width between the inner wall and the centrifugal fan is less than or equal to 50% of a diameter of a blade unit of the centrifugal fan,
the charger further comprises a rib extending from the inner surface of the casing such that the rib is disposed adjacent to the air outlet,
the centrifugal fan is supported by the rib such that the centrifugal fan is separated from the inner surface of the casing,
the rib is disposed at a peripheral portion of the air feed port of the centrifugal fan,
a recess is defined in an outer surface of the casing, and
the air outlet is disposed in the recess.

4. The charger according to claim 1, wherein
when the charger is placed on a placement plane, air is fed from the air feed port of the centrifugal fan in a down direction perpendicular to the placement plane, and
the air outlet is disposed below the air feed port.

5. The charger according to claim 1, wherein in the direction of the rotation axis, the width between the inner wall and the centrifugal fan is less than or equal to 50% of a diameter of a blade unit of the centrifugal fan.

6. The charger according to claim 1, further comprising a rib extending from the inner surface of the casing such that the rib is disposed adjacent to the air outlet,
wherein the centrifugal fan is supported by the rib such that the centrifugal fan is separated from the inner surface of the casing.

7. The charger according to claim 6, wherein the rib is disposed at a peripheral portion of the air feed port of the centrifugal fan.

8. The charger according to claim 1, wherein
a recess is defined in an outer surface of the casing, and
the air outlet is disposed in the recess.

9. The charger according to claim 1, wherein
the centrifugal fan comprises:
a fan casing including the air feed port; and
a blade rotatably supported within the fan casing,
in the direction of the rotation axis of the centrifugal fan,
the width between the inner wall and the centrifugal fan is equal to a width between the inner wall and the fan casing, and
the width of the centrifugal fan is equal to a width of the fan casing.

* * * * *